US010848159B2

(12) United States Patent
Murakami et al.

(10) Patent No.: US 10,848,159 B2
(45) Date of Patent: Nov. 24, 2020

(54) DRIVE CIRCUIT, PHYSICAL QUANTITY SENSOR, AND ELECTRONIC DEVICE

(71) Applicant: Panasonic Intellectual Property Management Co., Ltd., Osaka (JP)

(72) Inventors: Hideyuki Murakami, Osaka (JP); Takeshi Uemura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 399 days.

(21) Appl. No.: 15/549,392

(22) PCT Filed: Apr. 11, 2016

(86) PCT No.: PCT/JP2016/001965
§ 371 (c)(1),
(2) Date: Aug. 8, 2017

(87) PCT Pub. No.: WO2016/166960
PCT Pub. Date: Oct. 20, 2016

(65) Prior Publication Data
US 2018/0041217 A1 Feb. 8, 2018

(30) Foreign Application Priority Data

Apr. 13, 2015 (JP) .................. 2015-081389
Apr. 21, 2015 (JP) .................. 2015-086427

(51) Int. Cl.
*H03L 5/00* (2006.01)
*G01C 19/5776* (2012.01)
(Continued)

(52) U.S. Cl.
CPC ............ *H03L 5/00* (2013.01); *G01C 19/5614* (2013.01); *G01C 19/5776* (2013.01);
(Continued)

(58) Field of Classification Search
CPC ... H03L 5/00; H03L 7/091; H03L 7/06; H03L 2207/50; H03B 5/364; G01C 19/5614; G01C 19/5776
(Continued)

(56) References Cited

U.S. PATENT DOCUMENTS 5,473,640 A * 12/1995 Bortolini .................. H03L 3/00
331/18
9,709,400 B2 * 7/2017 Kapusta ............ G01C 19/5712
(Continued)

FOREIGN PATENT DOCUMENTS

| JP | 4-113941 | 4/1992 |
|---|---|---|
| JP | 2003-247829 | 9/2003 |

(Continued)

OTHER PUBLICATIONS

International Search Report of PCT application No. PCT/JP2016/001965 dated Jun. 28, 2016.

*Primary Examiner* — Richard Tan
(74) *Attorney, Agent, or Firm* — McDermott Will & Emery LLP

(57) ABSTRACT

A drive circuit is configured to drive an oscillator to vibrate the oscillator that outputs a monitor signal according to a physical quantity. The drive circuit includes a drive signal generating unit that generates a drive signal having a drive frequency, a phase difference detector that detects a phase difference between the monitor signal and the drive signal, a frequency controller that controls the drive frequency based on the phase difference, automatic gain control (AGC) unit that controls an amplitude of the drive signal according to an amplitude of the monitor signal, and an output unit that outputs the drive signal having the controlled amplitude to the oscillator. This drive circuit can stably drive and vibrate the oscillator.

15 Claims, 19 Drawing Sheets

(51) Int. Cl.
*G01C 19/5614* (2012.01)
*H03L 7/091* (2006.01)
*H03B 5/36* (2006.01)
*H03L 7/06* (2006.01)

(52) U.S. Cl.
CPC ............... *H03B 5/364* (2013.01); *H03L 7/06* (2013.01); *H03L 7/091* (2013.01); *H03L 2207/50* (2013.01)

(58) Field of Classification Search
USPC ........................................................ 331/109
See application file for complete search history.

(56) References Cited

U.S. PATENT DOCUMENTS

| | | | |
|---|---|---|---|
| 2002/0163390 A1* | 11/2002 | Richardson | H03L 7/085 331/17 |
| 2007/0163344 A1 | 7/2007 | Ohuchi et al. | |
| 2008/0143398 A1* | 6/2008 | Fujiwara | H03L 7/093 327/156 |
| 2011/0109330 A1 | 5/2011 | Ikuta et al. | |
| 2015/0020596 A1 | 1/2015 | Yamauchi et al. | |

FOREIGN PATENT DOCUMENTS

| | | |
|---|---|---|
| JP | 2005-249646 | 9/2005 |
| JP | 2008-224581 | 9/2008 |
| JP | 2011-099833 | 5/2011 |
| JP | 2015-021780 | 2/2015 |

* cited by examiner

DRIVE CIRCUIT, PHYSICAL QUANTITY SENSOR, AND ELECTRONIC DEVICE

TECHNICAL FIELD

The present invention relates to a drive circuit for driving an oscillator for detecting a physical quantity applied from outside, and a physical quantity sensor and an electronic device including the circuit and the oscillator.

BACKGROUND ART

PTL 1 discloses a conventional physical quantity sensor capable of detecting physical quantities, such as angular velocity and acceleration. The physical quantity sensor includes an oscillator and causes the oscillator to vibrate with a drive circuit.

PTL 2 discloses a conventional amplifier circuit having a function limiting an output range.

CITATION LIST

Patent Literature

PTL 1: Japanese Patent Laid-Open Publication No. 2005-249646

PTL 2: Japanese Patent Laid-Open Publication No. 2008-224581

SUMMARY

A drive circuit is configured to drive an oscillator to vibrate the oscillator that outputs a monitor signal according to a physical quantity. The drive circuit includes a drive signal generating unit that generates a drive signal having a drive frequency, a phase difference detector that detects a phase difference between the monitor signal and the drive signal, a frequency controller that controls the drive frequency based on the phase difference, automatic gain control (AGC) unit that controls an amplitude of the drive signal according to an amplitude of the monitor signal, and an output unit that outputs the drive signal having the controlled amplitude to the oscillator.

This drive circuit can stably drive and vibrate the oscillator.

DETAIL DESCRIPTION OF PREFERRED EMBODIMENTS

A physical quantity sensor according to exemplary embodiments will be described below with reference to the drawings. In each figure, same parts are indicated by same reference marks, and their description may be omitted as appropriate. Each figure shows an example of preferred embodiment, and the structures, shapes, and numerical values therein are not restrictive. It is possible to combine technical elements described in the exemplary embodiments as needed as long as the combinations do not cause inconsistencies.

Exemplary Embodiment 1

Figure 1:
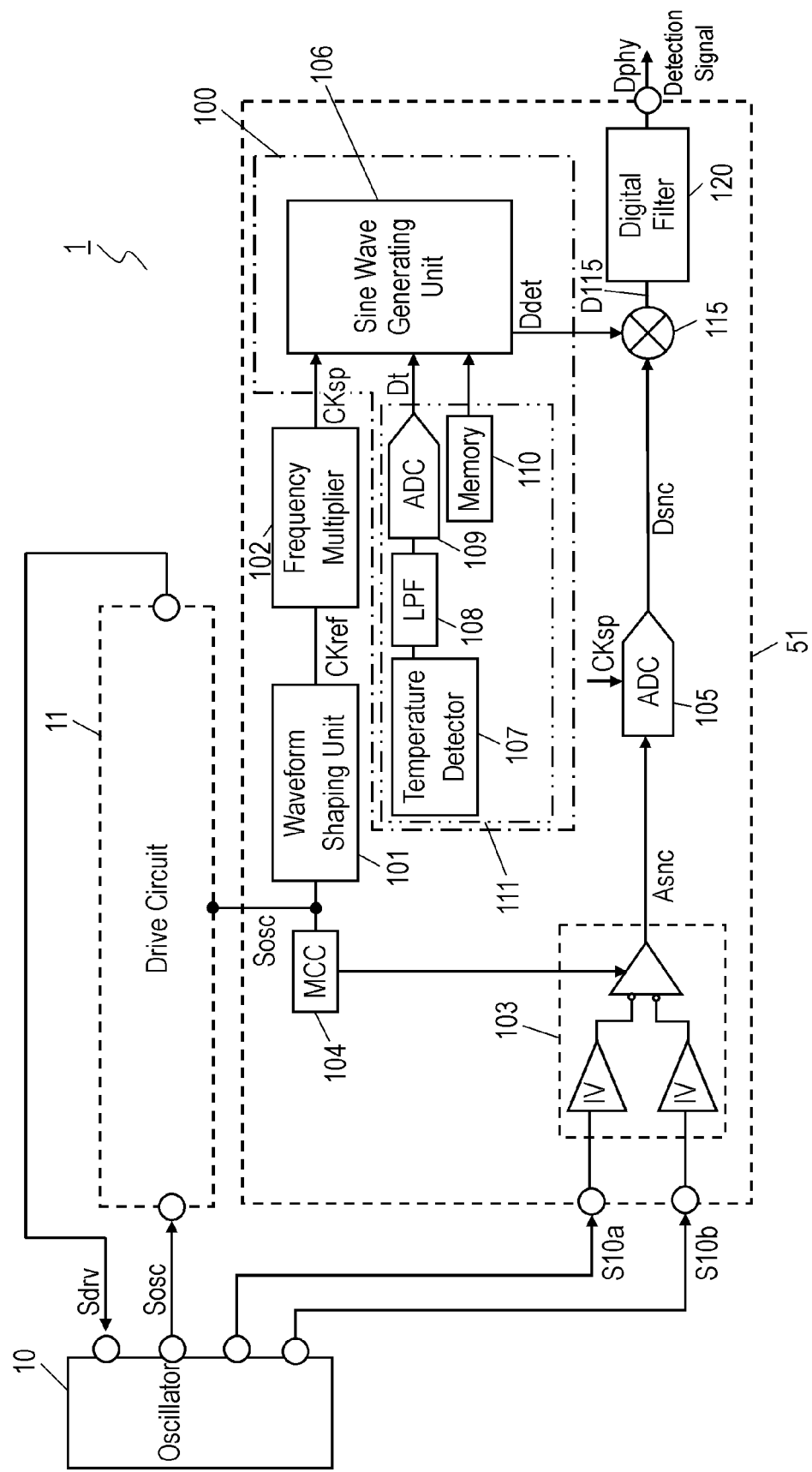
FIG. 1 is a schematic diagram of a physical quantity sensor according to Exemplary Embodiment 1.

FIG. 1 is a schematic diagram of physical quantity sensor 1 according to Exemplary Embodiment 1. Physical quantity sensor 1 includes oscillator 10, drive circuit 11, and physical-quantity detecting circuit 51.

Drive circuit 11 supplies drive signal Sdrv having predetermined drive frequency fdrv to oscillator 10. Oscillator 10 outputs sensor signals S10a and S10b according to physical quantities, such as an angular velocity or acceleration, supplied from outside. The frequency of sensor signals S10a and S10b corresponds to frequency fdrv of drive signal Sdrv. For example, the center frequency of sensor signals S10a and S10b corresponds to frequency fdrv of drive signal Sdrv, and is substantially identical to frequency fdrv. In physical quantity sensor 1 according to Embodiment 1, oscillator 10 is a tuning fork-type angular velocity sensor that outputs sensor signals S10a and S10b according to an angular velocity, a physical quantity, supplied from outside. Drive circuit 11 supplies drive signal Sdrv to oscillator 10. Oscillator 10 vibrates due to drive signal Sdrv, and outputs monitor signal Sosc according to the vibration. Drive circuit 11 adjusts frequency fdrv and amplitude Adrv of drive signal Sdrv according to monitor signal Sosc from oscillator 10. Physical-quantity detecting circuit 51 detects a physical quantity applied to the oscillator based on sensor signals S10a and S10b from oscillator 10.

Drive circuit 11 will be described below.

Figure 2:
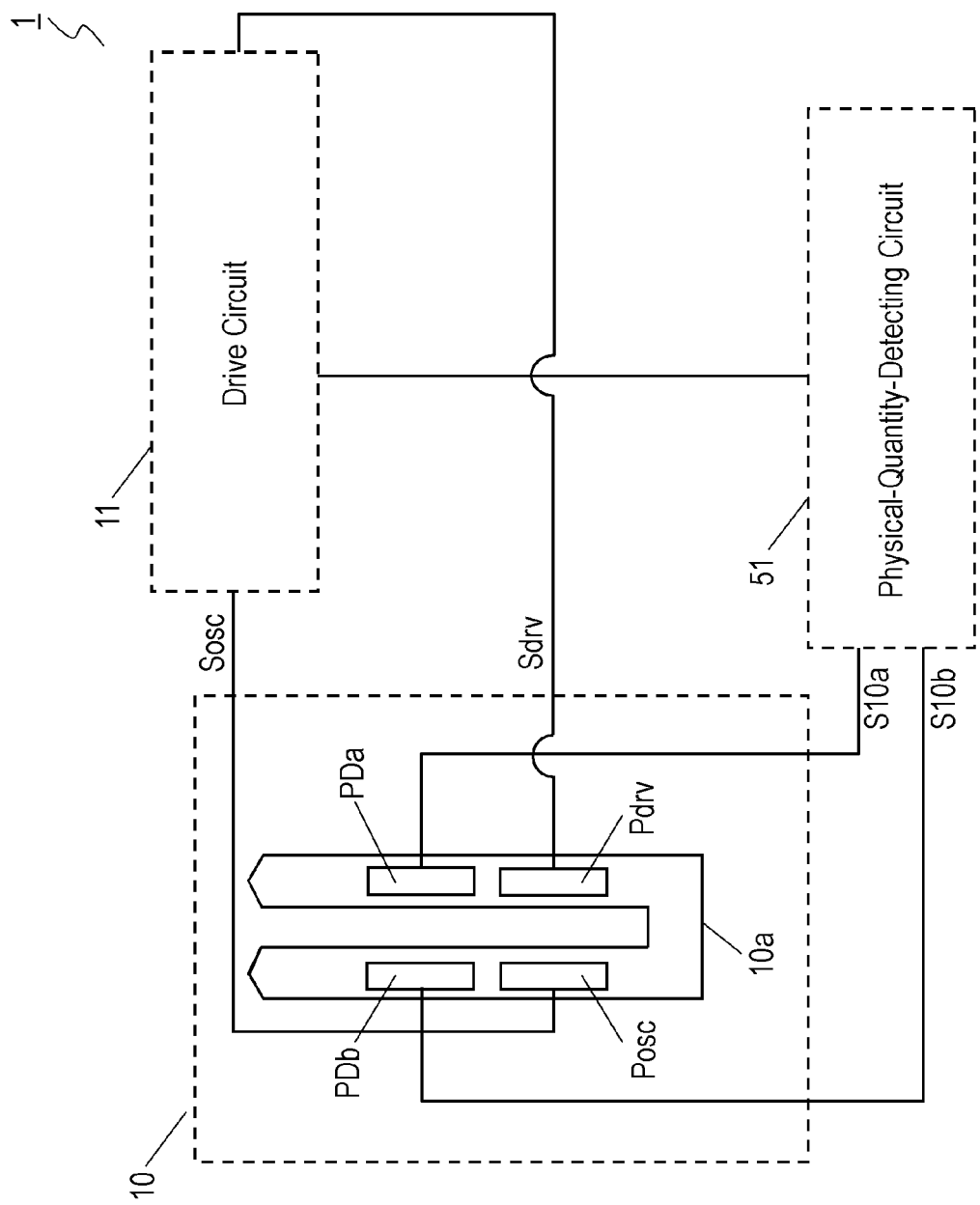
FIG. 2 is a block diagram of the physical quantity sensor according to Embodiment 1.

FIG. 2 is a block diagram of physical quantity sensor 1. Oscillator 10 has oscillator body 10a having a tuning fork shape, driving piezoelectric element Pdrv, oscillation-detecting piezoelectric element Posc, and physical-quantity-detecting piezoelectric elements PDa and PDb. Driving piezoelectric element Pdrv drives oscillator body 10a to vibrate oscillator body 10a according to frequency fdrv and amplitude Adrv of drive signal Sdrv from drive circuit 11. This vibration causes oscillation-detecting piezoelectric element Posc to generate electric charges and produce monitor signal Sosc, a current of the flow of the electric charges. When a physical quantity, i.e., a rotational angular velocity, is applied to oscillator body 10a, electric charges according to the rotational angular velocity (Coriolis force) are generated in physical-quantity-detecting piezoelectric elements PDa and PDb, thereby producing sensor signals S10a and S10b, electric currents of the flow of the electric charges.

Figure 3:
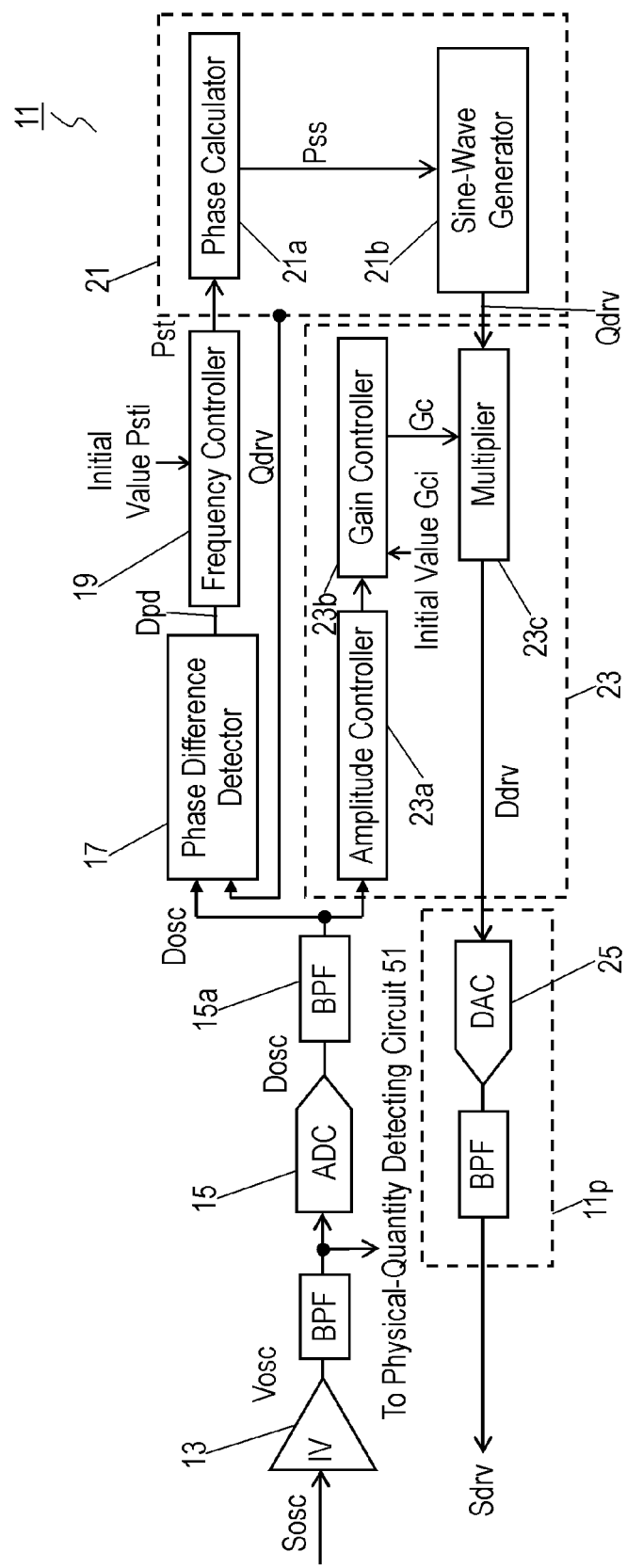
FIG. 3 is a block diagram of a drive circuit of the physical quantity sensor according to Embodiment 1.

FIG. 3 is a block diagram of drive circuit 11.

Current-voltage (IV) converter 13 converts monitor signal Sosc, the electric current output from oscillator 10, to monitor signal Vosc, a voltage.

Analog-digital converter (ADC) 15 converts monitor signal Vosc output from IV converter 13 into digital values, monitor signal Dosc. A filter, such as a low-pass filter (LPF) or a band-pass filter (BPF), may be connected either upstream or downstream, or both upstream and downstream of ADC 15. In drive circuit 11 according to Embodiment 1, as shown in FIG. 3, a BPF is provided at each of both upstream and downstream of ADC 15.

Phase difference detector 17 receives monitor signal Dosc output from ADC 15 and drive signal Qdrv having a digital value along a sine wave generated in drive signal generating unit 21. By performing an arithmetic operation to monitor signal Dosc and drive signal Qdrv generated by drive signal generating unit 21, phase difference detector 17 calculates phase difference information Dpd according to phase difference Pd between monitor signal Dosc and drive signal Qdrv, and outputs phase difference information Dpd to frequency controller 19.

Frequency controller 19 calculates phase step value Pst that determines drive frequency fdrv of drive signal Sdrv based on phase difference information Dpd supplied from phase difference detector 17, and outputs phase step value Pst to drive signal generating unit 21.

Drive signal generating unit 21 generates drive signal Qdrv, a digital value of a sine wave, based on phase step value Pst obtained from frequency controller 19, and outputs drive signal Qdrv to automatic gain control (AGC) unit 23. Drive signal generating unit 21 includes phase calculator 21a and sine-wave generator 21b. Phase calculator 21a outputs phase information Pss ranging from 0 to $2\pi$ according to phase step value Pst. Phase calculator 21a cumulates phase step values Pst obtained from frequency controller 19 at predetermined constant time intervals to obtain a cumulative value, and calculates a remainder as phase information Pss obtained by dividing the cumulative value by $2\pi$. Phase calculator 21a may obtain a subtraction value by subtracting $2\pi$ from the cumulative value one or more times until the subtraction value falls within the range equal to or larger than 0 and smaller than $2\pi$, and then employ the subtraction value as phase information Pss. Sine-wave generator 21b includes, for example, a CORDIC arithmetic circuit, and generates drive signal Qdrv having a difital value of a sine wave by calculating amplitude information corresponding to phase information Pss.

AGC unit 23 includes amplitude detector 23a, gain controller 23b, and multiplier 23c.

Amplitude detector 23a detects amplitude Damp of monitor signal Dosc.

Multiplier 23c multiplies gain value Gc calculated by gain controller 23b by drive signal Qdrv generated by drive signal generating unit 21 so as to generate drive signal Ddrv, which is a gain-controlled digital value, and outputs drive signal Qdrv to output unit 11p. Output unit 11p includes digital-analog converter (DAC) 25 which receives drive signal Ddrv. DAC 25 converts drive signal Ddrv into drive signal Sdrv which is an analog signal, and outputs drive signal Sdrv to oscillator 10. Output unit 11p may include a LPF or a BPF connected downstream of DAC 25. This configuration preferably provides high SN ratio.

Drive circuit 11 according to Embodiment 1 performs frequency control with phase characteristics of oscillator 10. This operation will be detained below.

Figure 4:
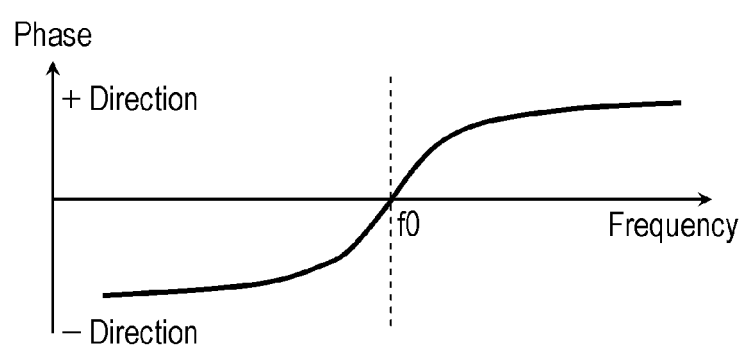
FIG. 4 illustrates phase characteristics of an oscillator of the physical quantity sensor according to Embodiment 1.

FIG. 4 illustrates phase characteristics of oscillator 10. Oscillator 10 has resonance frequency f0. The phase of the vibration of oscillator 10 advances when the phase changes in a positive (+) direction with respect to resonance frequency f0. The phase of the vibration of oscillator 10 delays when the phase changes in a negative (−) direction. When the frequency of drive signal Qdrv is higher than resonance frequency f0, the phase changes in the positive direction and advances. When the frequency of drive signal Qdrv is lower than resonance frequency f0, the phase changes in the negative direction and delays.

Figure 5A:
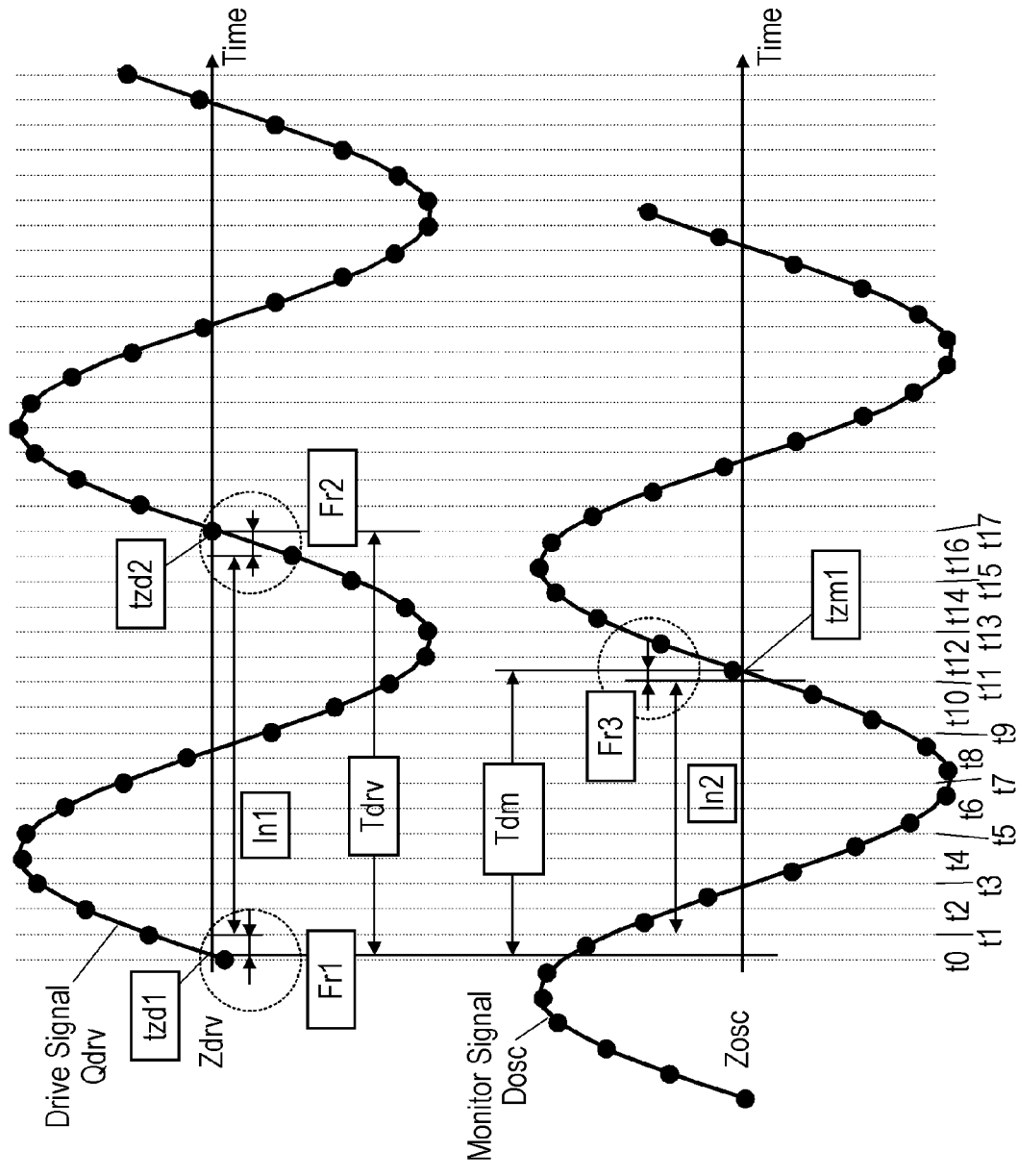
FIG. 5A illustrates a phase difference measurement method by a phase difference detector of the physical quantity sensor according to Embodiment 1.

FIG. 5A illustrates a method of measuring phase difference Pd by phase difference detector 17. In FIG. 5A, the horizontal axis represents time, and the vertical axis represents values of drive signal Qdrv and monitor signal Dosc. Drive signal Qdrv takes value Qdrv(tN) at sampling point tN (where N is an integer). Each of the values of drive signal Qdrv and monitor signal Dosc changes within a width of the amplitude from zero at the center of the width, and repetitively takes a positive value and a negative value alternately.

In order to measure phase difference Pd between monitor signal Dosc and drive signal Qdrv accurately, the phase difference is measured at zero-crossing points where monitor signal Dosc and drive signal Qdrv cross the zero point, not around vertices of monitor signal Dosc and drive signal Qdrv. The amount of change of the signal is larger around the zero-crossing point than around the vertex, hence decreasing the measurement error of a signal level and a calculation error in calculating the phase difference.

In drive circuit 11 according to Embodiment 1, ADC 15 and sections that process digital signals operate based on a sampling clock having a predetermined sampling period Ts. Phase difference detector 17 samples drive signal Qdrv and monitor signal Dosc at sampling points t0, t1, . . . at time intervals of sampling period Ts. Phase difference detector 17 according to Embodiment 1 detects zero-crossing points tzd1 and tzd2 of drive signal Qdrv and zero-crossing point tzm1 of monitor signal Dosc. In accordance with Embodiment 1, zero-crossing points tzd1 and tzd2 of drive signal Qdrv are time points at which the value of drive signal Qdrv crosses the zero value while changing from a negative value to a positive value. Zero-crossing point tzm1 of monitor signal Dosc is a time point at which the value of monitor signal Dosc crosses the zero value while changing from a negative value to a positive value. The zero value of drive signal Qdrv and the zero value of monitor signal Dosc are center value Zdrv of drive signal Qdrv and center value Zosc of monitor signal Dosc, respectively. That is, in accordance with Embodiment 1, zero-crossing points tzd1 and tzd2 of drive signal Qdrv are the time points at which the value of drive signal Qdrv crosses center value Zdrv of drive signal Qdrv in a rising direction in which drive signal Qdrv increases. Zero-crossing point tzm1 of monitor signal Dosc is the time point at which the value of monitor signal Dosc crosses center value Zosc of monitor signal Dosc in a rising direction in which monitor signal Dosc increases. More specifically, zero-crossing point tzd2 of drive signal Qdrv is the next zero-crossing point of zero-crossing point tzd1 of drive signal Qdrv, that is, the zero-crossing point firstly appearing subsequent to zero-crossing point tzd1 of drive signal Qdrv. Zero-crossing point tzm1 of monitor signal Dosc is the zero-crossing point firstly appearing subsequent to zero-crossing point tzd1 of drive signal Qdrv. Zero-crossing point tzd2 of drive signal Qdrv is the zero-crossing point firstly appearing subsequent to zero-crossing point tzm1 of monitor signal Dosc.

Drive signal Qdrv and monitor signal Dosc may cross the center values in a falling direction at zero-crossing points. In other words, at zero-crossing points tzd1 and tzd2 of drive signal Qdrv, the value of drive signal Qdrv may cross center value Zdrv in a falling direction in which drive signal Qdrv changes from a positive value to a negative value. In this case, at zero-crossing point tzm1 of monitor signal Dosc, the value of monitor signal Dosc crosses center value Zosc in a falling direction in which monitor signal Dosc changes from a positive value to a negative value.

Phase difference detector 17 calculates phase difference Pd with period Tdrv of drive signal Qdrv and time difference Tdm from zero-crossing point tzd1 of drive signal Qdrv to zero-crossing point tzm1 of monitor signal Dosc according to Formula 1.

$$Pd = \frac{Tdm}{Tdrv} \qquad \text{[Formula 1]}$$

Phase difference detector 17 obtains period Tdrv of drive signal Qdrv as follows.

Phase difference detector 17 obtains fractional part Fr1 which is a duration from zero-crossing point tzd1 of drive signal Qdrv to the first sampling point t1 subsequent to zero-crossing point tzd1.

Phase difference detector 17 measures integer part In1 which is a duration that can be counted by the sampling clock from sampling point t1 to sampling point t16 immediately before zero-crossing point tzd2 of drive signal Qdrv.

Phase difference detector 17 obtains fractional part Fr2 which is a duration from sampling point t16 to zero-crossing point tzd2 of drive signal Qdrv.

Phase difference detector 17 obtains period Tdrv of drive signal Qdrv according to Formula 2.

$$Tdm = Fr1 + In2 + Fr3 \qquad \text{[Formula 2]}$$

Phase difference detector 17 obtains time difference Tdm between zero-crossing point tzd1 of drive signal Qdrv and zero-crossing point tzm1 of monitor signal Dosc as follows.

Phase difference detector 17 measures integer part In2 which is a duration that can be counted by the sampling clock from sampling point t1 to sampling point t11 immediately before zero-crossing point tzm1 of monitor signal.

Phase difference detector 17 obtains fractional part Fr3 which is a duration from sampling point t11 to zero-crossing point tzm1 of monitor signal Dosc.

Phase difference detector 17 obtains time difference Tdm between zero-crossing point tzd1 of drive signal Qdrv and zero-crossing point tzm1 of monitor signal Dosc according to Formula 3.

$$Tdm = Fr1 + In2 + Fr3 \qquad \text{[Formula 3]}$$

Figure 5B:
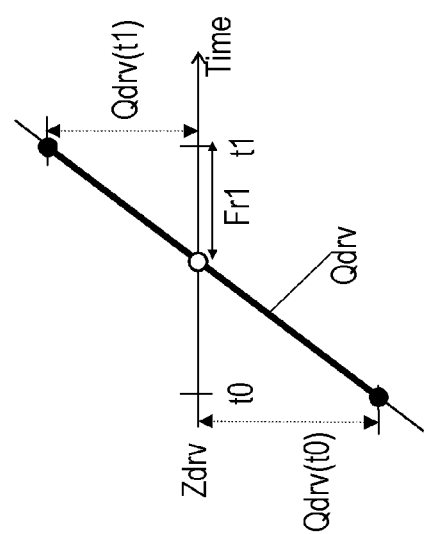
FIG. 5B is an enlarged view of FIG. 5A.

FIG. 5B illustrates a method for phase difference detector 17 to measure fractional part Fr1, and shows a region around zero-crossing point tzd1 shown in FIG. 5A while enlarging the region. Phase difference detector 17 obtains fractional part Fr1 with value Qdrv(t0) of drive signal Qdrv at sampling point t0 immediately before zero-crossing point tzd1 and value Qdrv(t1) of drive signal Qdrv at sampling point t1 subsequent to sampling point t0, that is, at sampling point t1 immediately subsequent to zero-crossing point tzd1 according to Formula 4.

$$Fr1 = \frac{Qdrv(t1)}{Qdrv(t0) + Qdrv(t1)} \qquad \text{[Formula 4]}$$

Similarly, phase difference detector 17 obtains fractional part Fr2 with value Qdrv(t16) of drive signal Qdrv at sampling point t16 immediately before zero-crossing point tzd2 and value Qdrv(t17) of drive signal Qdrv at sampling point t17 subsequent to sampling point t16, that is, at sampling point t17 immediately subsequent to zero-crossing point tzd2 according to Formula 5.

$$Fr2 = \frac{Qdrv(t16)}{Qdrv(t16) + Qdrv(t17)} \qquad \text{[Formula 5]}$$

Similarly, phase difference detector 17 obtains fractional part Fr3 with value Qdrv(t11) of drive signal Qdrv at sampling point t11 immediately before zero-crossing point tzm1 and value Qdrv(t12) of drive signal Qdrv at sampling point t12 subsequent to sampling point t11, that is, at sampling point t12 immediately subsequent to zero-crossing point tzm1 according to Formula 6.

$$Fr3 = \frac{Qdrv(t11)}{Qdrv(t11) + Qdrv(t12)} \qquad \text{[Formula 6]}$$

Phase difference detector 17 outputs phase difference information Dpd according to phase differences Pd calculated by Formulae 1 to 6.

An operation of frequency controller 19 will be described below.

Figure 6:
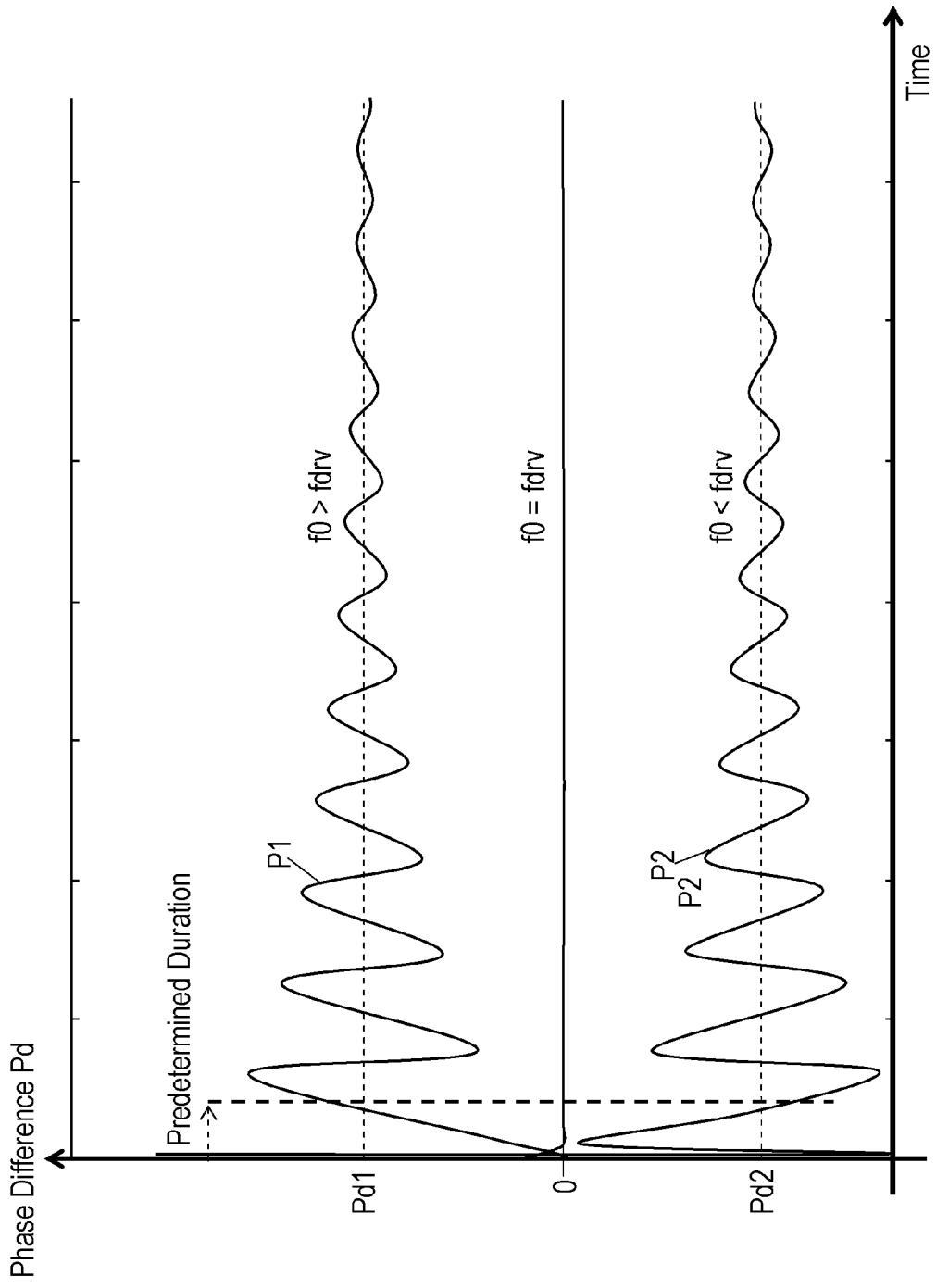
FIG. 6 illustrates a phase difference in the physical quantity sensor according to Embodiment 1.

FIG. 6 illustrates phase difference Pd between monitor signal Dosc and drive signal Qdrv. As illustrated in FIG. 6, when drive frequency fdrv shifts from resonance frequency f0 of oscillator 10, phase difference Pd between drive signal Qdrv and monitor signal Dosc converges toward the phase difference shown in FIG. 4 over time. But until the convergence, phase difference Pd changes over time as shown in FIG. 6 depending on the difference between drive frequency fdrv and resonance frequency f0. Thus, the gradients of the phase changes over time change depending on the amount of the shift of frequency. Specifically, when resonance frequency f0 is higher than drive frequency fdrv, phase difference Pd converges over time to positive value Pd1 according to property P1. When resonance frequency f0 is lower than drive frequency fdrv, phase difference Pd converges over time to negative value Pd2 according to property P2.

The drive circuit of the physical quantity sensor disclosed in PTL 1 performs a band-pass filter (BPF) process and an automatic gain control (AGC) process on the monitor signal of the oscillator, and outputs the processed signal as a drive signal. In this drive circuit, when the monitor signal contains unnecessary components, the drive signal also contain the unnecessary components, consequently preventing the drive circuit to cause stable driving and oscillation.

Drive circuit 11 according to Embodiment 1 roughly tunes drive frequency fdrv to resonance frequency f0 of oscillator 10 first at a startup mode. The startup mode reduces the time until the convergence in the case that drive frequency fdrv at an initial start stage is drastically different from resonance frequency f0 of oscillator 10. In addition, in the measuring of phase difference Pd, a large error may occur since the amplitude of monitor signal Dosc is small in a duration at the initial stage. However, monitor signal Dosc in this duration is not used to control frequency fdrv, thereby allowing frequency fdrv to be controlled stably.

In the startup mode, the operation is performed with predetermined initial value Psti of phase step value Pst and predetermined initial value Gci of gain value Gc for predetermined duration Ti in the starting during which the output from oscillator 10 is not generated upon being turned on. Drive signal Sdrv having a fixed amplitude based on predetermined initial value Gci of gain value Gc and a fixed frequency based in predetermined initial value Psti of phase step value Pst is output to oscillator 10 for predetermined duration Ti. Initial value Psti and initial value Gci as well as predetermined duration Ti is preferably stored in, e.g. a memory. In order to initially tune drive frequency fdrv to resonance frequency f0 in that state, frequency controller 19 calculates phase step value Pst based on the measured phase at the time point when predetermined duration Ti elapses. Frequency controller 19 calculates phase step value Pst(m) at time point t(m) with phase difference Pd(m) at time point t(m), step value Pst(m−1) at time point t(m−1) immediately before time point t(m), and frequency control factor K1 at the time of starting (wherein m is an integer) according to Formula 7. Thus, timer with predetermined duration Ti is operated at the time of starting, and drive frequency fdrv is controlled by frequency controller 19 based on phase difference Pd that has been calculated at the time point when predetermined duration Ti elapses.

$$Pst(m)=Pst(m-1)+K1 \times Pd(m) \quad \text{[Formula 7]}$$

After completion of the startup mode, the operation shifts to a steady mode. In the steady mode, frequency controller 19 controls drive frequency fdrv by a proportional-derivative (PD) control. Frequency controller 19 obtains phase step value Pst(m) at time point t(m), with using phase difference Pd(m) at time point t(m), phase step value Pst(m−1) at time point t(m−1) immediately before time point t(m), phase difference Pd(m−1), P-component Kp of the frequency control factor in a steady state, and D-component Kd of the frequency control factor in a steady state according to Formula 8.

$$Pst(m)=Pst(m-1)+Kp \times Pd(m)+Kd \times (Pst(m)-Pst(m-1)) \quad \text{[Formula 8]}$$

P-component Kp is a proportional gain for controlling the manipulated variable as a linear function of a control valuable and a deviation from a target value. D-component Kd is a differential gain for controlling an input value proportional to the differential of phase difference Pd. This control may be proportional (P) control or proportional-integral-derivative (PID) control, depending on the target control characteristics.

This operation allows drive frequency fdrv to be equal to resonance frequency f0 of oscillator 10 based on phase difference Pd.

Next, AGC unit 23 performs a control operation, for example, by proportional control as described below.

First, at the time of starting, oscillator 10 is driven with a rectangular wave with a large amplitude. Then, the driving is performed with a sine wave with a controlled amplitude. The waveform is switched from the rectangular wave to the sine wave when amplitude Aosc of monitor signal Sosc reaches a predetermined amplitude value. After being switched to the sine wave, amplitude Aosc is measured repetitively at a predetermined period, gain value Gc of AGC unit 23 is calculated with using coefficients K21 and K22 according to Formula 9, and amplitude Aosc is controlled to maintain amplitude Aosc at a target drive amplitude.

$$Gc=K21 \times Aosc+K22 \quad \text{[Formula 9]}$$

Frequency fdrv of drive signal Qdrv (drive signal Ddrv) is controlled by detecting a difference between frequency fdrv of drive signal Qdrv and resonance frequency f0 based on phase difference Pd, and the amplitude of drive signal Ddrv is controlled by AGC control by detecting amplitude Aosc of monitor signal Dosc, as described above. This configuration drives oscillator 10 to vibrate oscillator 10 stably, providing precise physical quantity sensor 1.

ADC 15, phase difference detector 17, and AGC unit 23 may stop or may be intermittently driven. This configuration increases the period of control and reduces power consumption.

Physical-quantity detecting circuit 51 will be described below.

As illustrated in FIG. 1, physical-quantity detecting circuit 51 includes waveform shaping unit 101, frequency multiplier 102, detection-signal generating unit 100, input amplifier 103, analog-digital converter (ADC) 105, multiplier 115, and digital filter 120.

Waveform shaping unit 101 converts monitor signal Sosc to a rectangular wave and outputs the rectangular wave as reference clock CKref. For example, waveform shaping unit 101 is implemented by a comparator or an inverter. The frequency of reference clock CKref is identical to the frequency of sensor signals S10a and S10b. In the steady state, reference clock CKref is substantially identical to frequency fdrv of drive signal Sdrv.

Frequency multiplier 102 multiplies the frequency of reference clock CKref from waveform shaping unit 101 and generates frequency-multiplied clock CKsp having a frequency higher than the frequency of reference clock CKref. For example, frequency multiplier 102 is implemented by a phase locked loop (PLL).

Input amplifier 103 converts sensor signals S10a and S10b, currents from oscillator 10, into voltages, and outputs the voltages as analog sensor signal Asnc. Mechanical coupling canceller (MCC) 104 superimposes a MC signal obtained by adjusting the phase of drive signal Sdrv on analog sensor signal Asnc. This operation cancels at least a portion of an unnecessary signal, a signal unnecessary to detect the physical quantity, contained in analog sensor signal Asnc.

Analog-digital converter 105 samples analog sensor signal Asnc in synchronization with sampling clock CKsp and converts the sampled analog values (amplitude values) into digital values, digital sensor signal Dsnc. Analog sensor signal Asnc is thus converted into digital sensor signal Dsnc composed of plural digital values.

Detection-signal generating unit 100 includes sine-wave generating unit 106, temperature detector 107, low-pass filter (LPF) 108, analog-digital converter (ADC) 109, and memory 110.

Temperature information corresponds to a temperature obtained by temperature detector 107 is filtered by low-pass filter 108, and is converted into digital values, temperature information Dt, by analog-digital converter 109. The converted temperature information Dt is input into sine-wave generating unit 106 at a predetermined period. Memory 110 stores plural values of correction amount Ea, plural values of correction amount Eb, and plural values of correction amount Ec which correspond to plural values of temperature information Dt. Temperature detector 107, low-pass filter 108, analog-digital converter 109, and memory 110 constitute correction amount generating unit 111.

Figure 7:
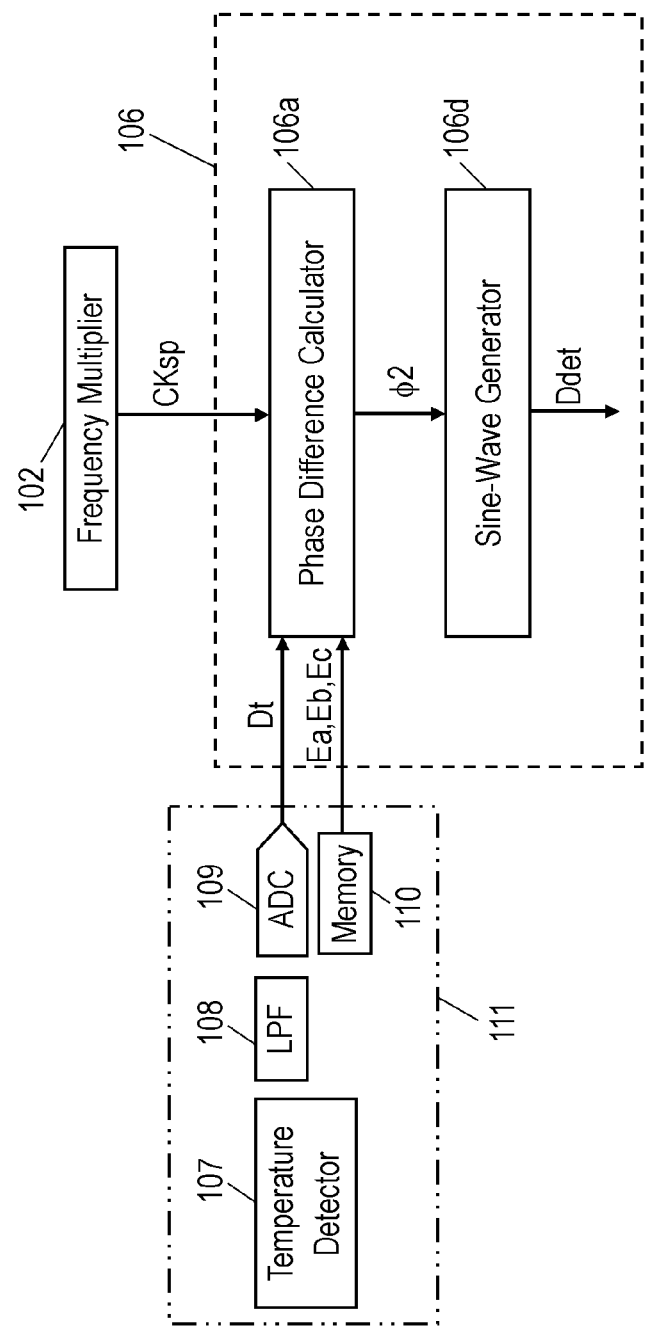
FIG. 7 is a block diagram of a sine-wave generating unit of the physical quantity sensor according to Embodiment 1.

FIG. 7 is a block diagram of sine-wave generating unit 106. Sine-wave generating unit 106 includes phase calculator 106a and sine-wave generator 106d, and is connected to correction amount generating unit 111.

Phase calculator 106a calculates phase $\phi 1$ based on frequency-multiplied clock CKsp obtained from frequency multiplier 102. Phase calculator 106a also obtains, from memory 110, the values of correction amounts Ea, Eb, and Ec corresponding to temperature information Dt obtained by temperature detector 107, and converts phase $\phi 1$ to calculate phase $\phi 2$ based on the obtained values of correction amounts Ea, Eb, and Ec. For example, phase $\phi 2$ can be calculated according to Formula 10.

$$\phi 2 = \phi 1 + Ea \times Dt^2 + Eb \times Dt + Ec \qquad \text{[Formula 10]}$$

Sine-wave generator 106d generates detection signal Ddet, which is a sine wave, by calculating the amplitude value corresponding to phase $\phi 2$, which is input from phase calculator 106a. Here, a CORDIC computation, for example, may be used as the computational method for generating a sine wave by feeding a certain phase.

Figure 8:
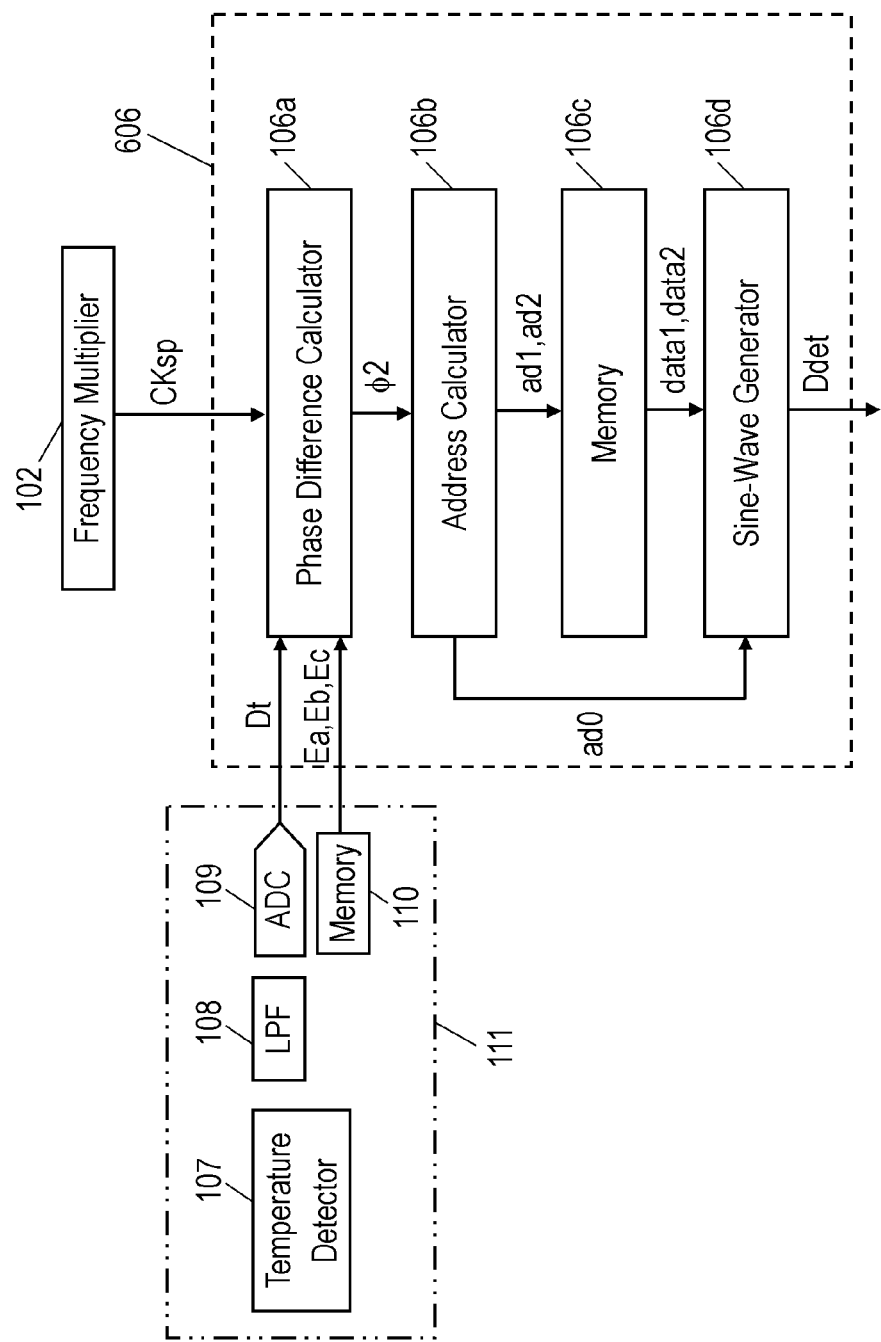
FIG. 8 is a block diagram of another sine-wave generating unit of the physical quantity sensor according to Embodiment 1.

FIG. 8 is a block diagram of another sine-wave generating unit 606 according to Embodiment 1. In FIG. 8, components identical to those of sine-wave generating unit 106 shown in FIG. 7 are dented by the same reference numerals.

Sine-wave generating unit 606 includes phase calculator 106a, address calculator 106b, memory 106c, and sine-wave generator 106d.

Phase calculator 106a calculates phase $\phi 1$ based on frequency-multiplied clock CKsp obtained from frequency multiplier 102. Phase calculator 106a obtains, from memory 110, the values of correction amounts Ea, Eb, and Ec corresponding to temperature information Dt obtained by temperature detector 107 and calculates phase $\phi 2$ by converting phase $\phi 1$ to phase $\phi 2$ based on the acquired values of correction amounts Ea, Eb, and Ec. Then, calculated phase $\phi 2$ is output to address calculator 106b.

Address calculator 106b stores addresses corresponding to plural values of phase $\phi 2$. Table 1 shows the values of phase $\phi 2$ and the addresses corresponding to the values of phase $\phi 2$ which are stored in address calculator 106b.

TABLE 1

| Value of Phase $\phi 2$ (rad) | Address |
| --- | --- |
| 0.000 | 0 |
| 0.025 | 1 |
| 0.049 | 2 |
| 0.074 | 3 |
| 0.098 | 4 |
| 0.123 | 5 |
| 0.147 | 6 |
| ... | ... |

Address calculator 106b an address out of the plural addresses which corresponds to phase $\phi 2$ input from phase calculator 106a, and outputs the selected address to memory 106c. More specifically, address calculator 106b selects address ad1 corresponding to a stored value out of the stored values of phase $\phi 2$ which is closest to the input value of phase $\phi 2$ and smaller than the input value of phase $\phi 2$, and selects address ad2 corresponding to a stored value out of the stored values of phase $\phi 2$ which is closest to the input value of phase $\phi 2$ and larger than the input value of phase $\phi 2$. Address calculator 106b outputs addresses ad1 and ad2 to memory 106c. For example, when the input value of phase $\phi 2$ is 0.06 (rad), address calculator 106b selects address "2", which corresponds to 0.049 (rad) which a stored value out of the stored values which is closest to 0.06 (rad) and smaller than 0.06 (rad), and selects address "3", which corresponds to 0.074 which is a stored value out of the stored values which is closest to 0.06 (rad) and larger than 0.06 (rad). Address calculator 106b outputs the selected addresses "2" and "3" to memory 106c. Address calculator 106b outputs addresses ad1 and ad2 to memory 106c. Address calculator 106b calculates address ad0 corresponding to phase $\phi 2$ with phase step Ps obtained by dividing $2\pi$ by the number of the addresses according to the following formula, and outputs address ad0 to sine-wave generator 106d.

$$ad0 = \phi 2 \times (1/Ps)$$

For example, in the case that phase $\phi 2$ is 0.06 (rad), phase step Ps is $2\pi/256$ in Table 1. Accordingly, address ad0 is calculated as:

$$ad0 = 0.06 \times (256/2) = 2.4446.$$

Memory 106c stores plural addresses and plural amplitude values corresponding to the addresses. Table 2 shows addresses and amplitude values stored in memory 106c.

TABLE 2

| Address | Amplitude Value |
| --- | --- |
| 0 | 0.000 |
| 1 | 0.025 |
| 2 | 0.049 |
| 3 | 0.074 |
| 4 | 0.098 |
| 5 | 0.123 |
| 6 | 0.147 |
| ... | ... |

Memory 106c outputs, to sine-wave generator 106d, amplitude values data1 and data 2 corresponding to addresses ad1 and ad2, respectively, that are input from address calculator 106b. For example, in the case that the selected addresses "2" and "3" are input to memory 106c, memory 106c outputs, to sine-wave generator 106d, an amplitude value "0.0049 (0.004907)" corresponding to address "2", and outputs, to sine-wave generator 106d, an amplitude value "0.0073 (0.007356)" corresponding to address "3".

Sine-wave generator 106d generates detection signal Ddet which is a sine wave using addresses ad0, ad1, and ad2 and amplitude values data1 and data 2 according to the following formula.

$$Ddet = data1 + (ad0 - ad1) \times (data2 - data1)$$

Multiplier 115 multiplies digital sensor signal Dsnc from analog-digital converter 105 by detection signal Ddet generated by sine-wave generating unit 106. Multiplier 115 thereby detects physical quantity signal D115 which corresponds to the physical quantity detected by oscillator 10.

In order to remove noise, digital filter 120 passes only low frequency components of physical quantity signal D115 detected by multiplier 115 as digital detected signal Dphy.

The above-described configuration can calculate a sine wave signal with arbitrary phase by an arithmetic operation.

This provides high precision adjustment of detection phase that cannot be achieved by analog-like adjustment or adjustment of detection signal or physical quantity signal in an actual time direction such as to be dependent on clock signal, through the arithmetic operation without increasing the clock frequency. In addition, when environment parameters, such as a temperature, are contained in the arithmetic operation for calculating the phase, detection can be carried out by using a sine wave signal with an appropriately adjusted phase as a detection signal and multiplying the detection signal by a signal to be detected, thus providing precise and low-cost physical quantity sensor 1 without increasing power consumption and circuit scale.

Oscillator 10 according to the Embodiment 1 may not necessarily have a tuning fork shape, but may have another shape, such as a circular column shape, a right triangular column shape, a right quadrangular column shape, or a ring shape.

Figure 9:
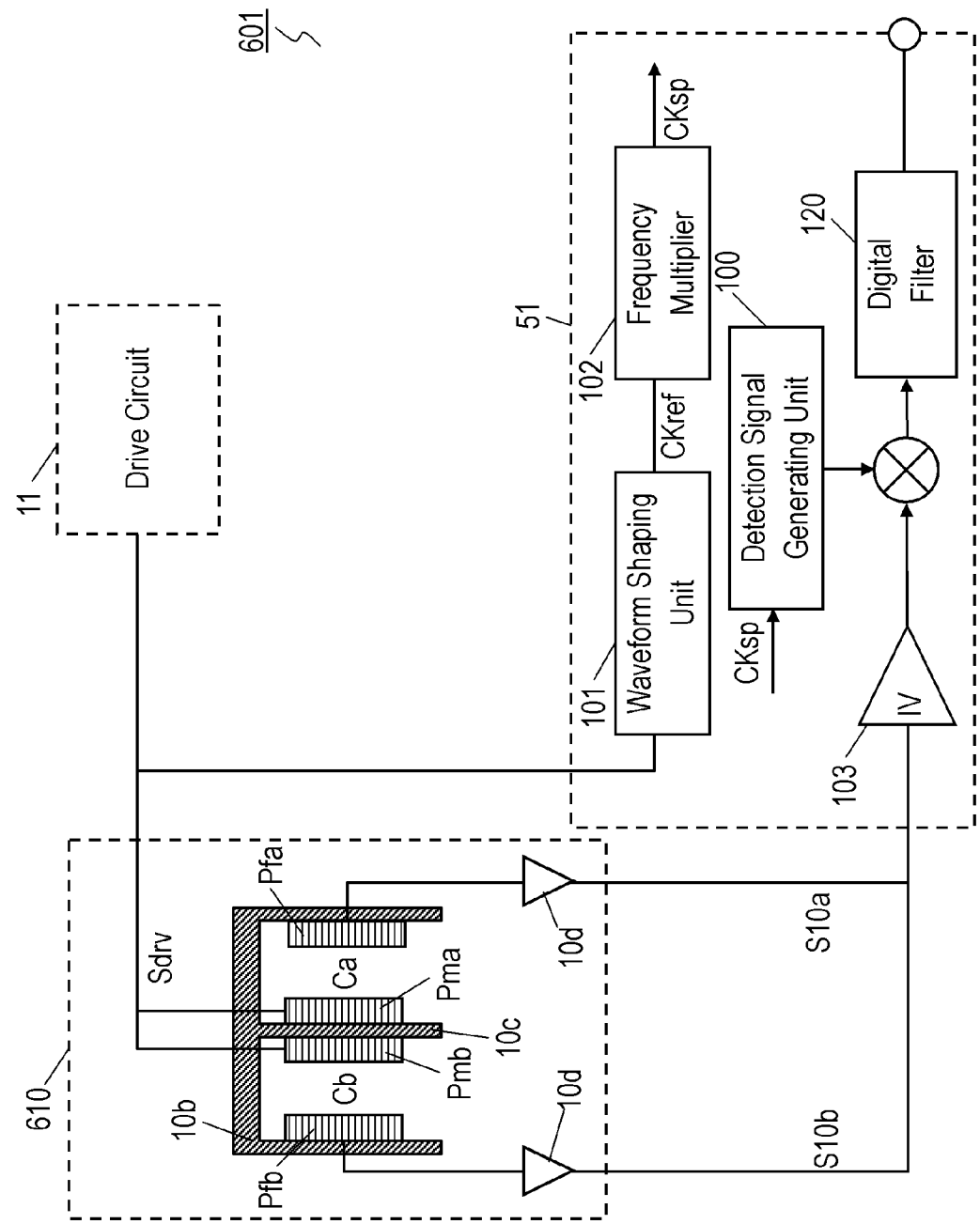
FIG. 9 is a block diagram of another physical quantity sensor according to Embodiment 1.

FIG. 9 is a block diagram of another physical quantity sensor 601 according to Embodiment 1. In FIG. 9, components identical to those of the physical quantity sensor 1 shown in FIGS. 1 and 2 are denoted by the same reference numerals. Physical quantity sensor 601 shown in FIG. 9 includes oscillator 610 which is a capacitance-type acceleration sensor instead of oscillator 10 of physical quantity sensor 1 shown in FIGS. 1 and 2. Oscillator 610 includes stationary portion 10b, movable portion 10c, movable electrodes Pma and Pmb, detection electrodes Pfa and Pfb, and differential amplifier 10d. Movable portion 10c is coupled to stationary portion 10b and is displaced according to acceleration. Movable electrodes Pma and Pmb are disposed on movable portion 10c. Detection electrodes Pfa and Pfb are disposed on stationary portion 10b and face movable electrodes Pma and Pmb, respectively. Movable electrode Pma and detection electrode Pfa constitute capacitor element Ca while movable electrode Pmb and detection electrode Pfb constitute capacitor element Cb. Drive signal Sdrv is supplied to capacitor elements Ca and Cb from drive circuit 11. Differential amplifier 10d outputs sensor signals S10a and S10b corresponding to a difference between charge amounts produced in detection electrodes Pfa and Pfb. Acceleration applied to movable portion 10c displaces movable portion 10c, hence increasing one of the capacitances of capacitor elements Ca and Cb and decreasing the other of the capacitances of capacitor elements Ca and Cb decreases. This causes a difference between the amounts of charges on detection electrodes Pfa and Pfb. The detection electrodes outputs sensor signals S10a and S10b corresponding to the difference.

Figure 10:
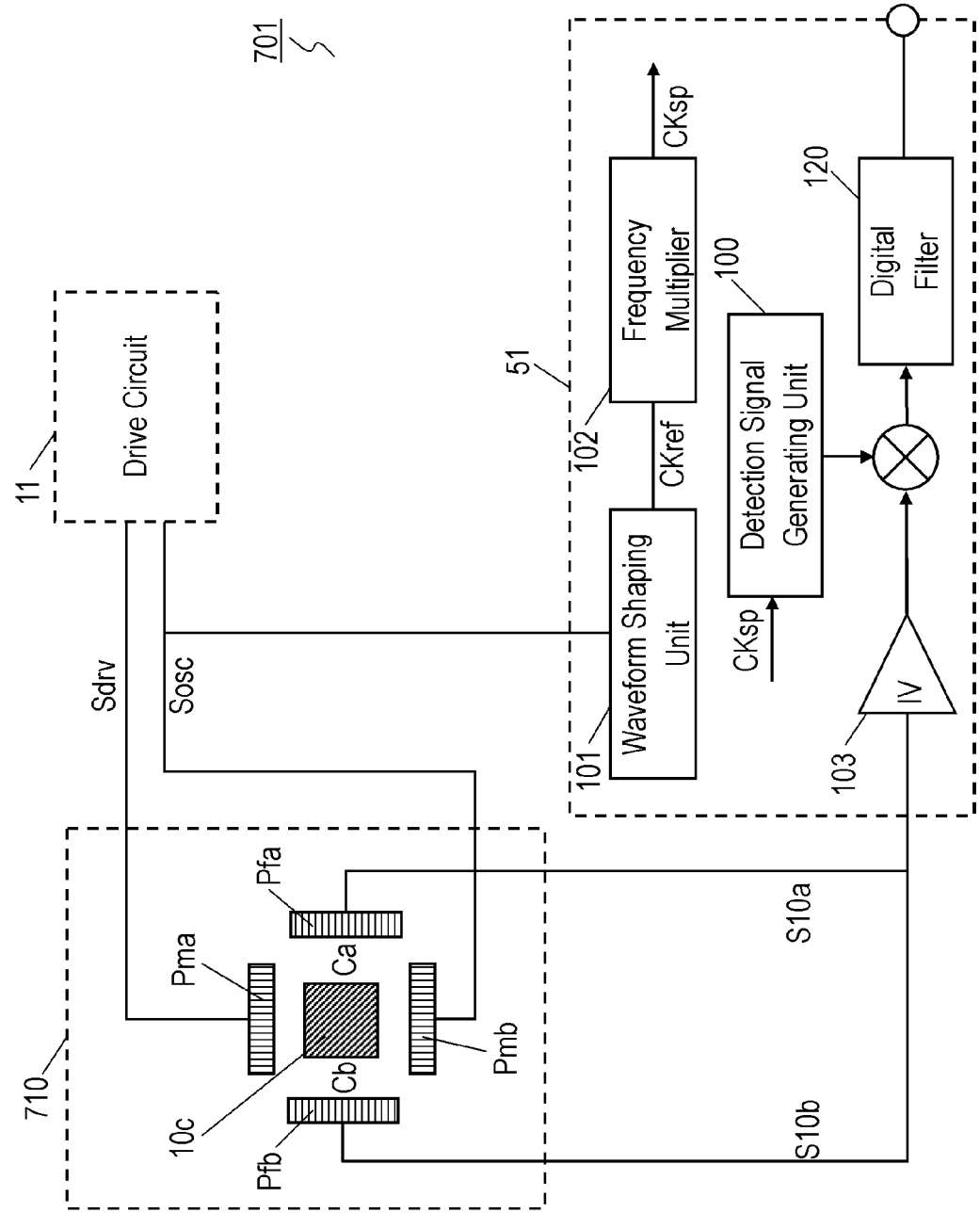
FIG. 10 is a block diagram of still another physical quantity sensor according to Embodiment 1.

FIG. 10 is a block diagram of still another physical quantity sensor 701 according to Embodiment 1. In FIG. 10, components identical to those of the physical quantity sensor 601 shown in FIG. 9 are denoted by the same reference numerals. Physical quantity sensor 701 shown in FIG. 10 includes oscillator 710, a capacitance-type angular velocity sensor, instead of oscillator 610 of physical quantity sensor 601 shown in FIG. 9. Drive signal Sdrv is supplied to oscillator 710 from drive circuit 11 to drive movable portion 10c to vibrate movable portion 10c. Rotation applied to oscillator 10 while vibrating allows movable portion 10c to cause detection oscillation according to the Coriolis force due to the rotation. The detection oscillation increases one of the capacitances of capacitor elements Ca and Cb, and decreases the other of the capacitances of capacitor elements Ca and Cb. This causes a difference between the amounts of charges on detection electrodes Pfa and Pfb. The detection electrodes output sensor signals S10a and S10b corresponding to the difference.

Figure 11:
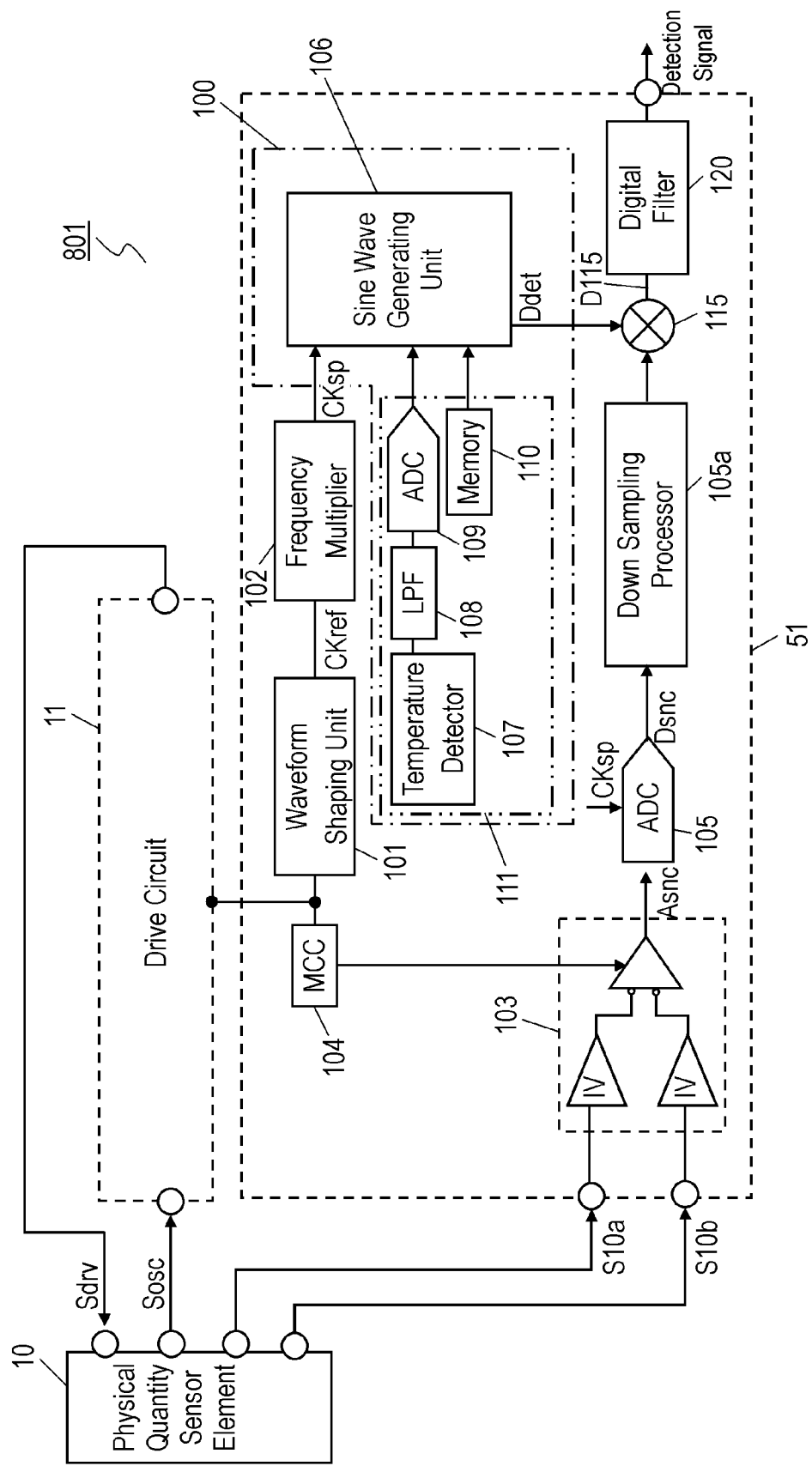
FIG. 11 is a block diagram of a further physical quantity sensor according to Embodiment 1.

FIG. 11 is a block diagram of further physical quantity sensor 801 according to Embodiment 1. In FIG. 11, components identical to those of physical quantity sensor 1 shown in FIG. 1 are denoted by the same reference numerals. Physical quantity sensor 801 further includes down-sampling processor 105a (decimation filter) connected downstream of AD converter 105. Down-sampling processor 105a thins out digital values from digital sensor signal Dsnc. Down-sampling processor 105a thins out digital sensor signal Dsnc to reduce the sampling frequency of digital sensor signal Dsnc and reduce the sampling frequency of digital physical quantity signal D115 supplied to digital filter 120. This configuration can reduce the circuit scale and power consumption of digital filter 120.

As illustrated in FIG. 3, band-pass filter 15a may be connected between ADC 15 and AGC unit 23 of drive circuit 11. Monitor signal Sosc input to waveform shaping unit 101 shown in FIG. 1 may be obtained either from the upstream or downstream of band-pass filter 15a.

Figure 12:
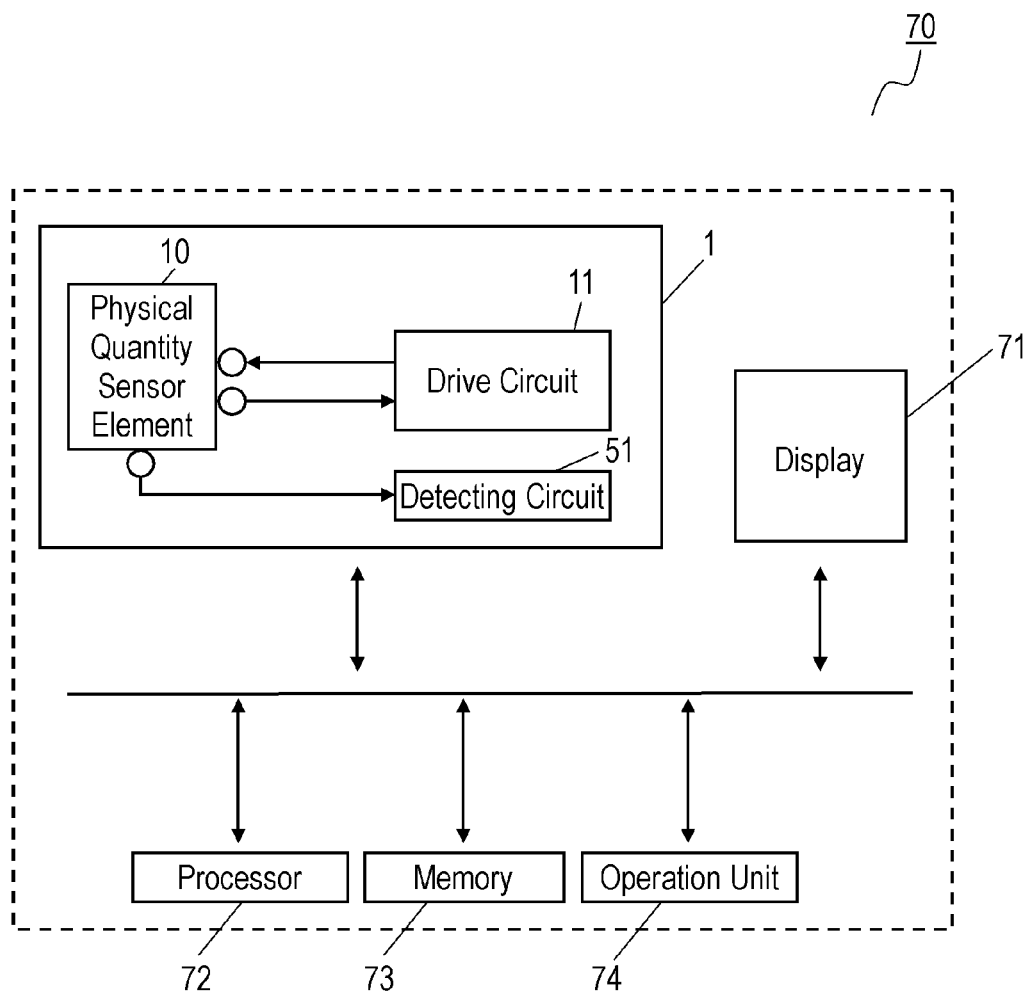
FIG. 12 is a schematic diagram of an electronic device according to Embodiment 1.

FIG. 12 is a block diagram of electronic device 70 including physical quantity sensor 1 according to Embodiment 1. Electronic device 70 may be, for example, a digital camera, and includes physical quantity sensor 1, display 71, processor 72, such as CPU, memory 73, and operating unit 74. Physical quantity sensor 1 is an angular velocity sensor. As illustrated in, e.g. FIG. 1, physical quantity sensor 1 includes oscillator 10, drive circuit 11, and physical-quantity detecting circuit 51. Physical quantity sensor 1 has a small size, small power consumption, and high precision. Therefore, in the case that electronic device 70 is a video camera or a digital still camera, electronic device 70 including physical quantity sensor 1 can have s small size, small power consumption, and precise processing, such as image stabilization.

Physical quantity sensor 1 according to Embodiment 1 provides electronic device 70 with high performance. Besides the digital cameras, electronic device 70 may be an automobile navigation system, a vehicle, an aircraft, or a robot.

As described above, drive circuit 11 is configured to drive oscillator 10 to vibrate oscillator 10. Oscillator 10 outputs monitor signal Sosc according to a physical quantity. Drive circuit 11 includes drive signal generating unit 21 generating drive signal Qdrv having drive frequency fdrv, phase difference detector 17 detecting phase difference Pd between monitor signal Dosc and drive signal Qdrv, frequency controller 19 controlling drive frequency fdrv based on phase difference Pd, AGC unit 23 controlling an amplitude of drive signal Ddrv according to an amplitude of monitor signal Dosc, output unit 11p outputting drive signal Sdrv having the controlled amplitude to oscillator 10.

Frequency controller 19 may detect a difference between drive frequency fdrv and resonance frequency f0 of oscillator 10 based on phase difference Pd so as to control drive frequency fdrv.

Output unit 11p may output a sine wave signal having a predetermined frequency and a predetermined amplitude to oscillator 10 when starting oscillator 10.

When oscillator 10 outputs a current of monitor signal Sosc, drive circuit 11 may detect the amplitude of monitor signal Sosc and may be switched to control drive signal Sdrv by AGC.

One of analog-digital converter unit 15, phase difference detector 17, and AGC unit 23 may operate intermittently.

Phase difference detector 17 may obtain phase difference Pd based on time difference Tdm between drive signal Qdrv and monitor signal Dosc and period Tdrv of drive signal Qdrv according to the following formula:

$$Pd = \frac{Tdm}{Tdrv}. \qquad \text{[Formula 1]}$$

Drive signal Qdrv crosses center value Zdrv of drive signal Qdrv at zero-crossing point tzd1 in a predetermined direction out of a rising direction and a falling direction, and crosses center value Zdrv of drive signal Qdrv at zero-crossing point tzd2 subsequent to zero-crossing point tzd1 in the predetermined direction. Phase difference detector 17 may be configured to sample drive signal Qdrv at sampling point t1 immediately subsequent to zero-crossing point tzd1 with a sampling clock. In this case, phase difference detector 17 is configured to sample drive signal Qdrv at sampling point t16 immediately before zero-crossing point tzd2 with the sampling clock. Phase difference detector 17 is configured to calculate period Tdrv of drive signal Qdrv based on fractional part Fr1 which is a duration from zero-crossing point tzd1 to sampling point t1, integer part In1 which is a duration from sampling point t1 to sampling point t16, and fractional part Fr2 which is a duration from sampling point t16 to zero-crossing point tzd2 according to the following formula:

$$Tdrv = Fr1 + In1 + Fr2 \qquad \text{[Formula 2]}$$

Monitor signal Dosc crosses center value Zosc of monitor signal Dosc at zero-crossing point tzm1 subsequent to sampling point t1 in the predetermined direction. Phase difference detector 17 may be configured to sample monitor signal Dosc from sampling point t1 to sampling point t11 immediately before zero-crossing point tzm1 with the sampling clock. In this case, phase difference detector 17 is configured to calculate a time difference Tdm between drive signal Qdrv and monitor signal Dosc based on integer part In2 corresponding to a duration from sampling point t1 to sampling point t11 and fractional part Fr3 corresponding to a duration from sampling point t11 to zero-crossing point tzm1 according to the following formula:

$$Tdm = Fr1 + In2 + Fr3 \qquad \text{[Formula 3]}$$

Phase difference detector 17 may start detecting phase difference Pd after a predetermined duration elapses after the starting of oscillator 10.

The frequency controller may control drive frequency fdrv by PD control in a steady state of oscillator 10.

Exemplary Embodiment 2

Figure 13:
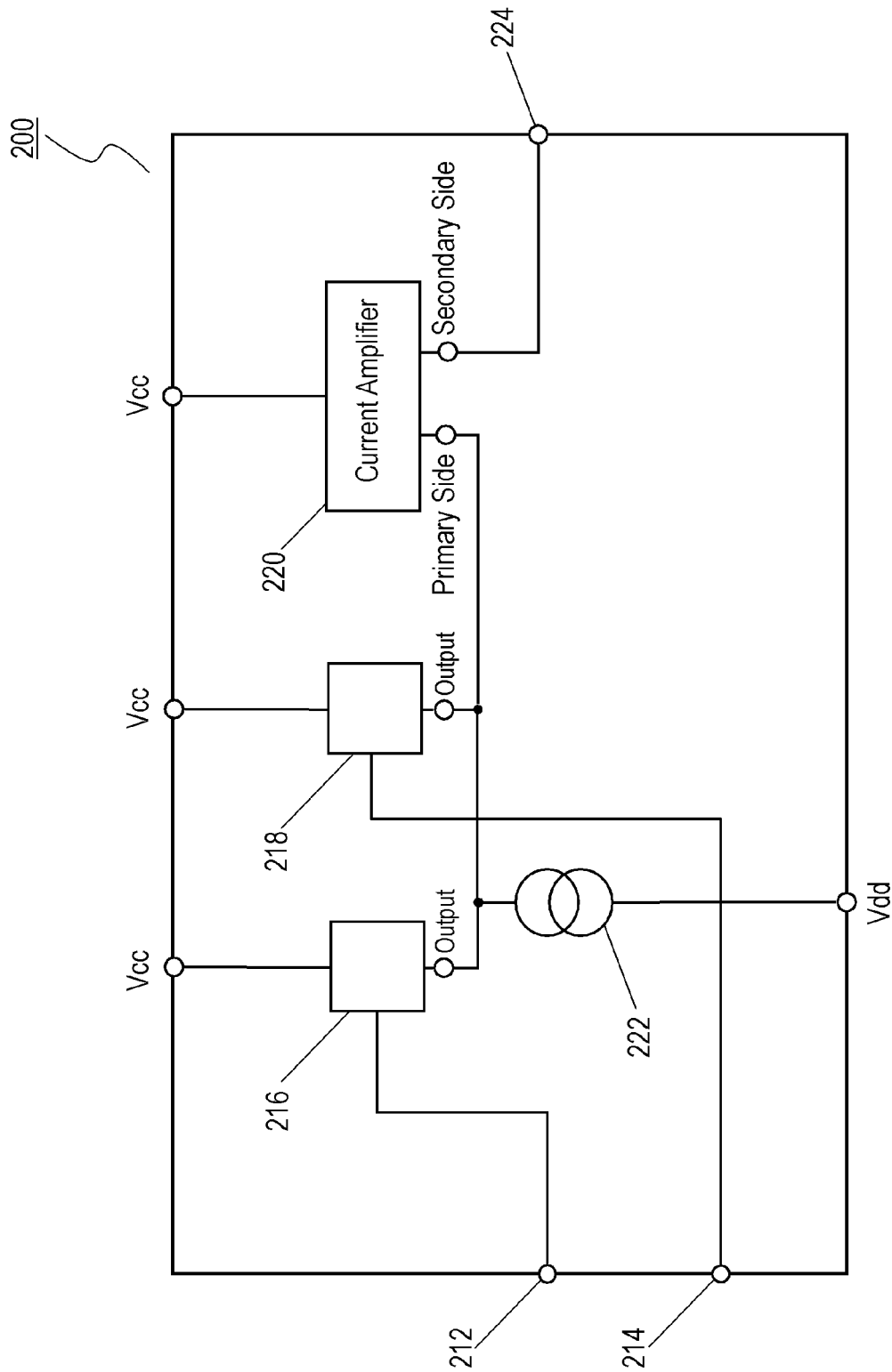
FIG. 13 is a block diagram of an amplifier circuit according to Exemplary Embodiment 2.

FIG. 13 is a block diagram of amplifier circuit 200 according to Exemplary Embodiment 2.

Amplifier circuit 200 includes input ports 212 and 214, transistor 216 connected to input port 212, transistor 218 connected input port 214, current amplifier 220 connected to an output port of transistor 216 and an output port of transistor 218, current source 222 connected between transistor 216 and current amplifier 220, and output port 224.

Input port 212 is a part to which an electric signal is input from outside. Input port 212 may not necessarily be a physical terminal but may be any part to which an electric signal is input from outside.

Input port 214 is a part to which an electric signal is input from outside. Input port 214 may not necessarily be a physical terminal but may be any part to which an electric signal is input from outside.

Transistor 216 is connected to input port 212. An output port of transistor 216 is connected to a primary side of current amplifier 220.

Transistor 218 is connected to input port 214. An output port of transistor 218 is connected to the primary side of current amplifier 220.

In other words, an output port of transistor 218 is connected between the output port of transistor 216 and the primary side of current amplifier 220.

Current source 222 is connected between the output port of transistor 216 and the primary side of current amplifier 220.

Output port 224 is connected to a secondary side of current amplifier 220, and is a part that outputs an electric signal to outside. Output port 224 may not necessarily be a physical terminal, but may be any part that outputs an electric signal to outside.

An operation of amplifier circuit 200 will be described below.

When a current output from transistor 216 increases, a current flowing through the primary side of current amplifier 220 decreases.

When the current output from transistor 216 decreases, the current flowing through the primary side of current amplifier 220 increases.

Output port 224, i.e., an output of amplifier circuit 200 becomes out of a limited range, transistor 216 has high impedance. This reduces the signal current output from transistor 216. At this moment, transistor 218 has low impedance, and a current output from transistor 218 increases. The current flowing through the primary side of current amplifier 220 is almost controlled by the output current of transistor 218. As a result, the current flowing through the secondary side of current amplifier 220 is also controlled, so that the output from output 224, i.e., the output of amplifier circuit 200, is controlled to a value input from input port 214.

In the case that P-channel FETs or PNP bipolar transistors are used for transistors 216 and 218 and current amplifier 220, potential Vcc connected to the sources or emitters of transistors 216 and 218 and current amplifier 220 is at a high potential while potential Vdd connected to current source 222 is at a low potential lower than potential Vcc.

In the case that N-channel FETs or NPN bipolar transistors are used for transistors 216 and 218 and current amplifier 220, potential Vcc connected to the sources or emitters of transistors 216 and 218 and current amplifier 220 is at a low potential while potential Vdd connected to current source 222 is at a high potential higher than potential Vcc.

A power source used for supplying the high potential may preferably be, for example, a stabilized power supply, such as power supply voltage.

A power source used for supplying the low potential may preferably be, for example, a ground potential.

The high and low potentials may also be connected via resistors.

Figure 14:
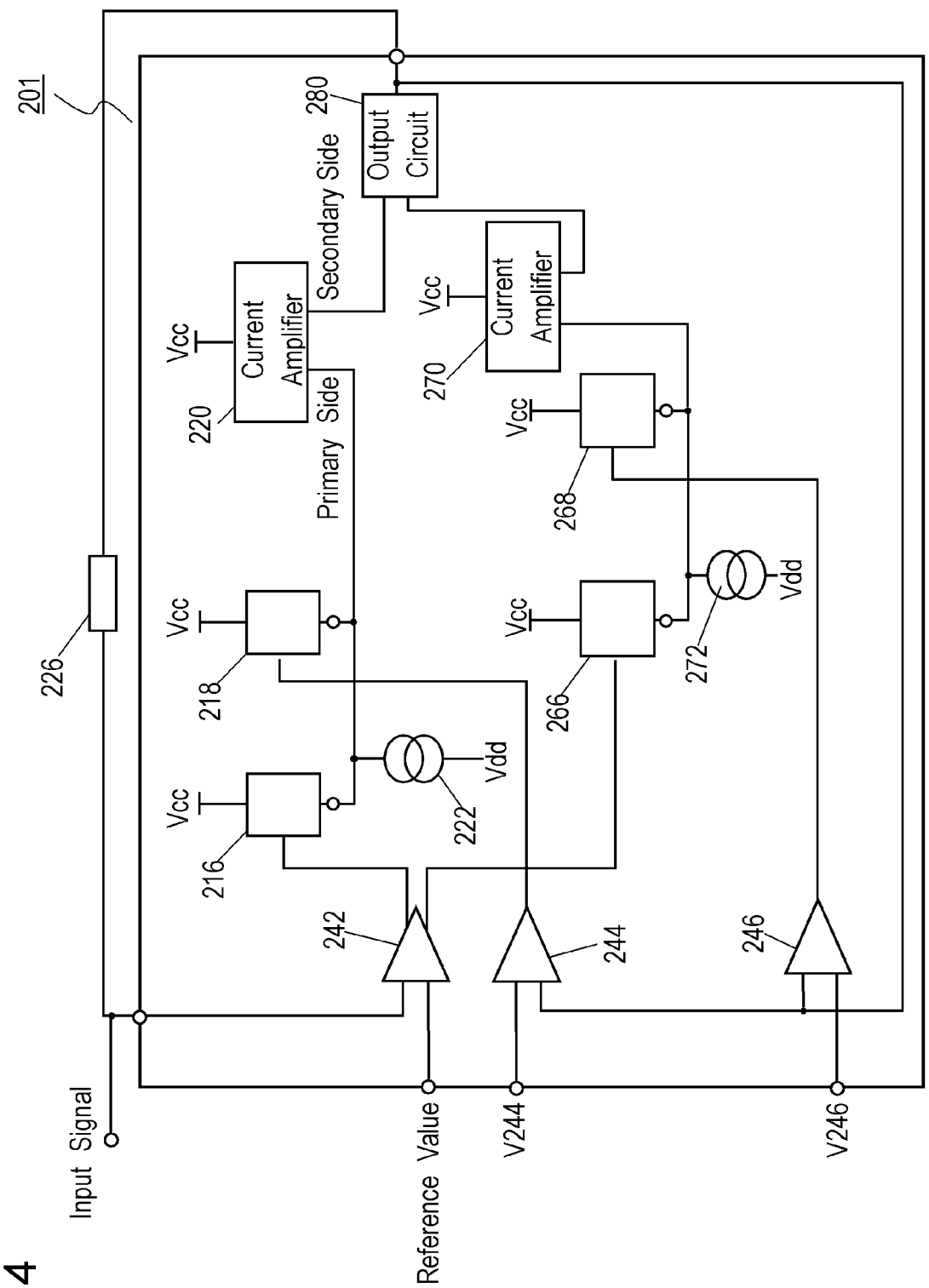
FIG. 14 is a block diagram of another amplifier circuit according to the second exemplary embodiment.

FIG. 14 is a block diagram of another amplifier circuit 201 according to Embodiment 2.

Amplifier circuit 201 includes amplifier 242 having differential output ports, amplifier 244, amplifier 246, transistor 216 connected to one of the output ports of amplifier 242, transistor 218 connected to an output port of amplifier 244, current source 222 connected to an output port of transistor 216 and an output port of transistor 218, current amplifier 220 connected to the output port of transistor 216 and the output port of transistor 218, transistor 266 connected to the other output port of amplifier 242, transistor 268 connected to an output port of amplifier 246, current source 272 connected to an output port of transistor 266 and an output port of transistor 268, current amplifier 270 connected to the output port of transistor 266 and the output port of transistor 268, and an output circuit 280 for providing a push-pull control output signal, connected to output ports of current amplifiers 220 and 270.

Current amplifier 220 has a primary side terminal and a secondary side terminal. The output port of transistor 216 and the output port of transistor 218 are connected to the primary side terminal of current amplifier 220.

Current amplifier 270 has a primary side and a secondary side. The output port of transistor 266 and the output port of transistor 268 are connected to the primary side terminal of current amplifier 270.

In the case that P-channel FETs or PNP bipolar transistors are used for transistors 216 and 218 and current amplifier 220, potential Vcc connected to the sources or emitters of transistors 216 and 218 and current amplifier 220 is at a high potential while potential Vdd connected to current source 222 is at a low potential lower than potential Vcc.

In the case that P-channel FETs or PNP bipolar transistors are used for transistors 266 and 268 and current amplifier 270, potential Vcc connected to the sources or emitters of transistors 266 and 268 and current amplifier 270 is at a high potential while potential Vdd connected to current source 272 is at a low potential lower than potential Vcc.

In the case that N-channel FETs or NPN bipolar transistors are used for transistors 216 and 218 and current amplifier 220, potential Vcc connected to the sources or emitters of transistors 216 and 218 and current amplifier 220 is at a low potential while potential Vdd connected to current source 222 is at a high potential higher than potential Vcc.

In the case that N-channel FETs or NPN bipolar transistors are used for transistors 266 and 268 and current amplifier 270, potential Vcc connected to the sources or emitters of transistors 266 and 268 and current amplifier 270 is at a low potential while potential Vdd connected to current source 272 is at a high potential higher than potential Vcc.

A power source used for supplying the high potential may preferably be, for example, a stabilized power supply, such as power supply voltage.

A power source used for supplying the low potential may preferably be, for example, a ground potential.

The high and low potentials may also be connected via resistors.

Figure 15:
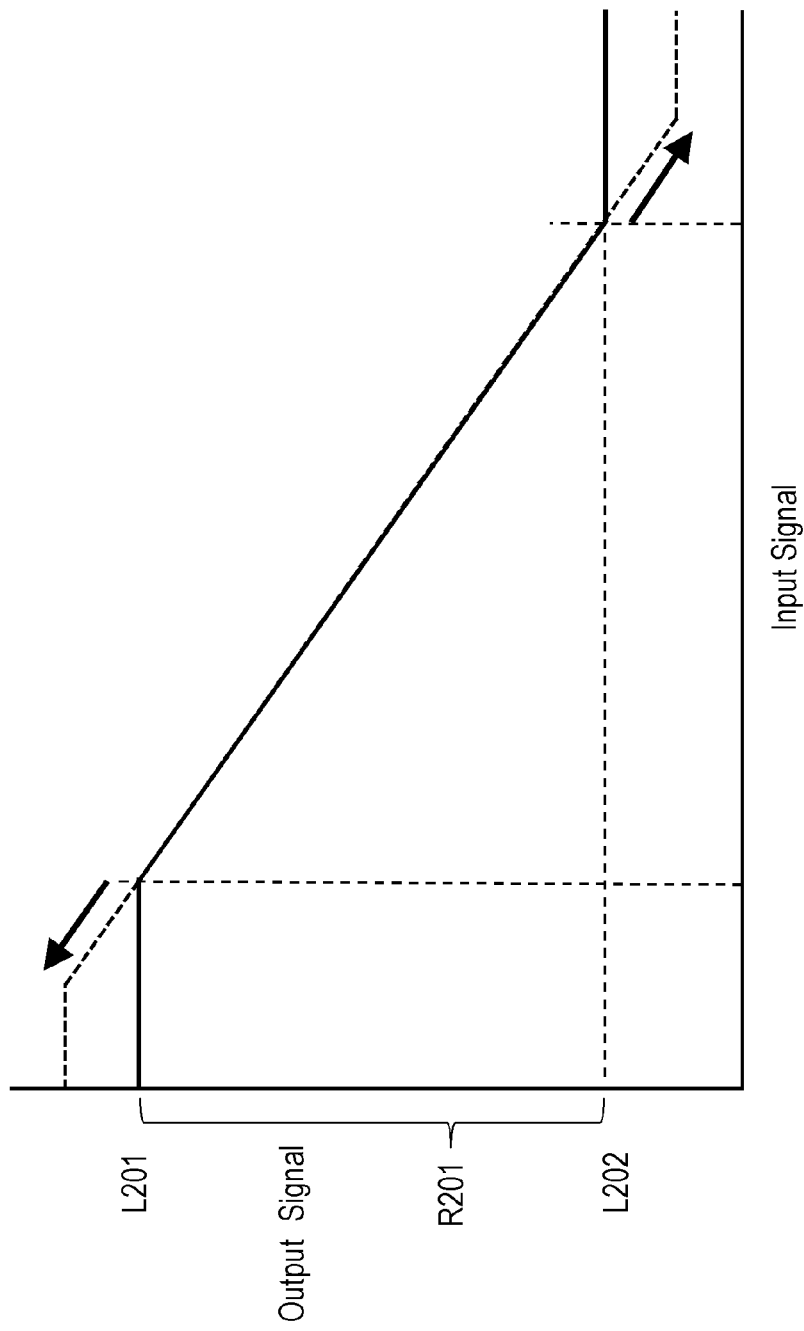
FIG. 15 illustrates output characteristics of the amplifier circuit according to Embodiment 2.

FIG. 15 illustrates output signals with respect to input signals in the case that the output port of amplifier circuit 201 constitutes a negative feedback connection.

FIG. 15 shows limited range R201 of the output of amplifier circuit 201, upper limit L201 of limited range R201, and lower limit L202 of limited range R201.

The output signal exceeding upper limit L201 is indicated by the dotted line at a position higher than upper limit L201.

The output signal below lower limit L202 is indicated by the dotted line at a position lower than lower limit L202.

When the output signal is within limited range R201, transistors 216 and 266 receive differential outputs of amplifier 242 to differentially operate, thereby controlling a out-flowing current and a lead-in current of output circuit 280. The output signal is thus output.

When the output signal increases beyond upper limit L201 of limited range R201, transistor 216 has high impedance while transistor 218 has low impedance due to a controlled by the output of amplifier 244. Thus, the current flowing through the primary side of current amplifier 220 is almost controlled by transistor 218.

Voltage V244 for setting upper limit L201 is input to one of the input ports of amplifier 244.

An output signal of output circuit 280 is fed back to the other input port of amplifier 244.

Transistor 218 is connected to the output port of amplifier 244.

Thus, the output port of amplifier 244 is substantially fixed to a potential substantially equal to upper limit L201.

When the output signal decrease below lower limit L202 of limited range R201, transistor 266 has high impedance while transistor 268 has low impedance due to a control by the output of amplifier 246. Thus, the current flowing through the primary side of current amplifier 270 is almost controlled by transistor 268.

Voltage V246 for setting lower limit L202 is input to one of the input ports of amplifier 246. An output signal of output circuit 280 is fed back to the other input port of amplifier 246.

Transistor 268 is connected to the output port of amplifier 246.

Thus, the output port of amplifier 246 is substantially fixed to a potential substantially equal to lower limit L202.

The amplifier circuit disclosed in PTL 2 can set limitation of output range for only one of the transistor sides that forms a pair with either one of high voltage side or low voltage side current source, so it cannot provide the output limiting function for both sides of high voltage side and low voltage side.

Amplifier circuit 201 according to Embodiment 2 can have high performance, such as excellent oscillation stability with low-voltage operation, fast operation, low output offset, low output impedance, and wide dynamic range, and it can provide output limitation for both the low potential side and the high potential side. This will be detailed below.

In amplifier circuit 201, the potential difference necessary between high potential and low potential is a potential corresponding to one transistor for on-voltage, and a potential corresponding to one transistor for saturation voltage. For this reason, amplifier circuit 201 can be operated by a low-voltage power source.

Transistors 216, 218, 266, and 268 are controlled by amplifiers 242, 244, and 246 with almost the same open gain. Current amplifier 220 is controlled by the sum of the output currents of transistors 216 and 218. Current amplifier 270 is controlled by the sum of the output currents of transistors 266 and 268. When the output signal is within limited range R201 and is about to exceed limited range R201, the open gain obtained by amplifier 242, transistor 216, and transistor 266, the open gain obtained by amplifier 244 and transistor 218, and the open gain obtained by amplifier 246 and transistor 268 are substantially equal to one another. The open gains of current amplifier 220, current amplifier 270, and output circuit 280 in the downstream stage are substantially equal to one another since they are used commonly. For this reason, an oscillation stabilizing circuit with substantially the same configuration can suppress oscillation of amplifier circuits 200 and 201. Thus, amplifier circuit 201 exhibits excellent oscillation stability.

Amplifier circuit 201 according to Embodiment 2 can obtain an operating current according to the output amplitude of the output signal because of push-pull control of output circuit 280. Accordingly, the output current can be large without passing large stand-by current. This configuration increases the operating speed of amplifier circuit 201.

Transistor 216, transistor 218, current amplifier 220, transistor 266, transistor 268, current amplifier 270, an active load of amplifier 242, an active load of amplifier 244, and an active load of amplifier 246 are implemented by the same type of transistors, either P-type or N-type. This configuration reduces an output offset.

Amplifier circuit 201 according to Embodiment 2 can reduce an output impedance because the output transistor and the transistor for providing output limitation are not connected in series. This configuration widens the setting range of output limitation, thus providing a wide dynamic range.

The amplifier circuit according to Embodiment 2 can provide output limitation for both low potential side and high potential side, hence being useful as an amplifier circuit used for various sensors.

Exemplary Embodiment 3

Figure 16:
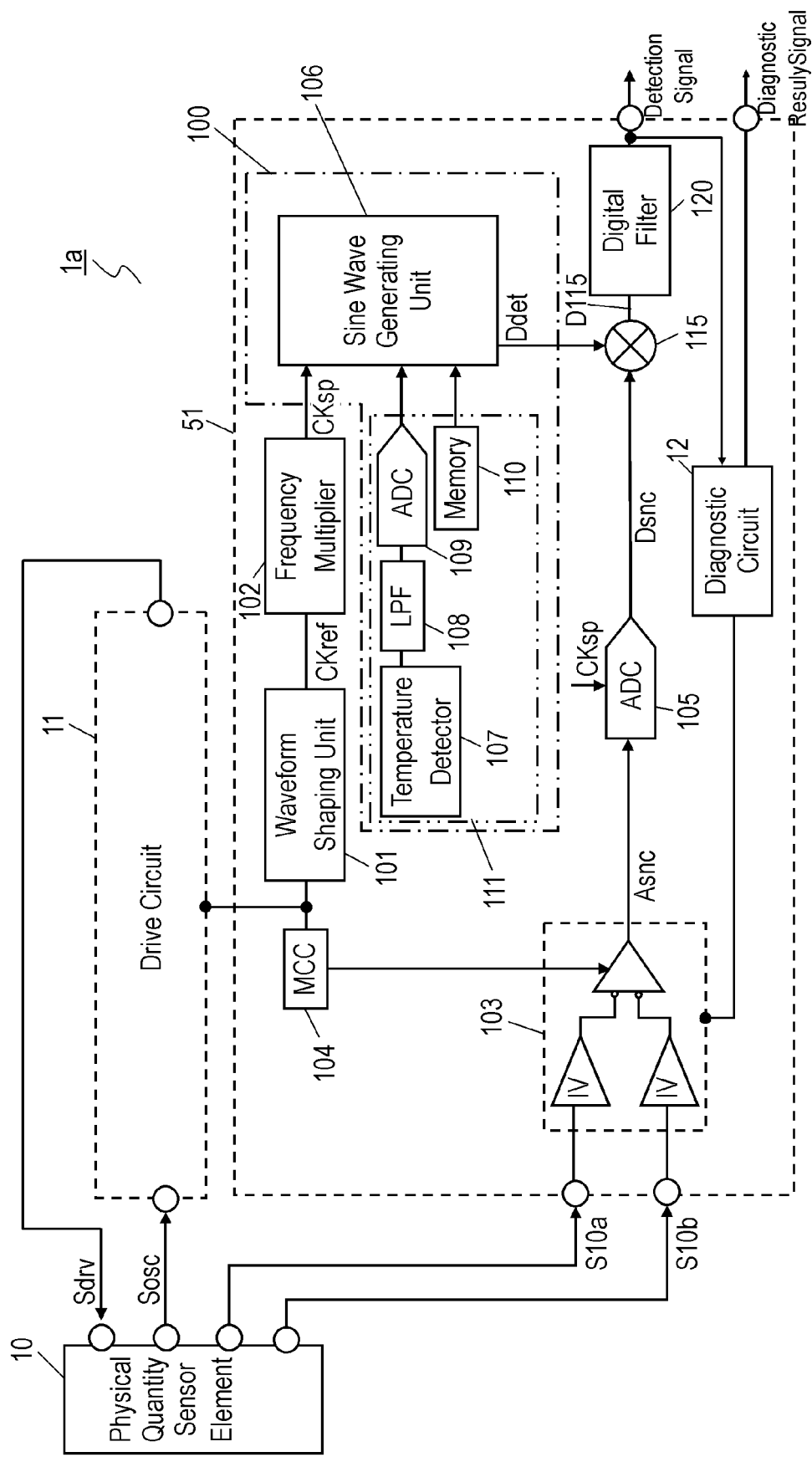
FIG. 16 is a schematic diagram of a physical quantity sensor according to Exemplary Embodiment 3.

FIG. 16 is a schematic diagram of physical quantity sensor 1a according to Exemplary Embodiment 3. In FIG. 16, components identical to those of the physical quantity sensor 1 according to Embodiment 1 shown in FIG. 1 are denoted by the same reference numerals. Physical quantity sensor 1a further includes diagnostic circuit 12 connected to input amplifier 103 and digital filter 120 of physical quantity sensor 1 according to Embodiment 1 shown in FIG. 1. Physical quantity sensor 1a includes input amplifier 103 which is implemented by amplifier circuit 200 shown in FIG. 13 or by amplifier circuit 201 shown in FIG. 14, according to Embodiment 2.

Diagnostic circuit 12 determines whether or not the signal input to input amplifier 103 is within a limited range for amplifier circuit 200 (201), and determines whether or not the digital values downstream of ADC 105 are within a limited range that is a normal range.

Diagnostic circuit 12 can precisely diagnose failures of physical quantity sensor 1a. This operation will be detailed below.

First, at least during a period in which diagnosis is carried out, limited range R201 for amplifier circuit 200 (201) of input amplifier 103 is wider than the dynamic range of ADC 105. In other words, upper limit L201 of limited range R201 is higher than the upper limit of the dynamic range of ADC 105 while lower limit L202 of limited range R201 is lower than the lower limit of the dynamic range of ADC 105. When a signal exceeding the upper limit of the dynamic range of ADC 105 is input, ADC 105 is saturated. Then, ADC 105 outputs an abnormal value which is not output when ADC 105 performs proper A-D conversion. Such a signal exceeding the upper limit of the dynamic range is, for example, a diagnostic signal that is input to input amplifier 103 for diagnostic purpose.

Diagnostic circuit 12 outputs a diagnostic result signal if diagnostic circuit 12 determines that the signal input to input amplifier 103 is outside limited range R201 and if ADC 105 does not output an abnormal value which is not output when ADC unit 105 performs A-D conversion properly. Diagnostic circuit 12 does not output the diagnostic result signal if diagnostic circuit 12 determines that the signal input to input amplifier 103 is outside limited range R201 and if ADC 105 outputs an abnormal value that is not output when ADC unit 105 performs A-D conversion properly. The diagnostic result signal indicates that ADC unit 105 or digital filter 120 downstream of ADC unit 105 does not operate properly.

The operation of diagnostic circuit 12 is not limited thereto. For example, diagnostic circuit 12 may monitor which of an analog block and a digital block of physical-quantity detecting circuit 51 has a failure.

Exemplary Embodiment 4

Figure 17:
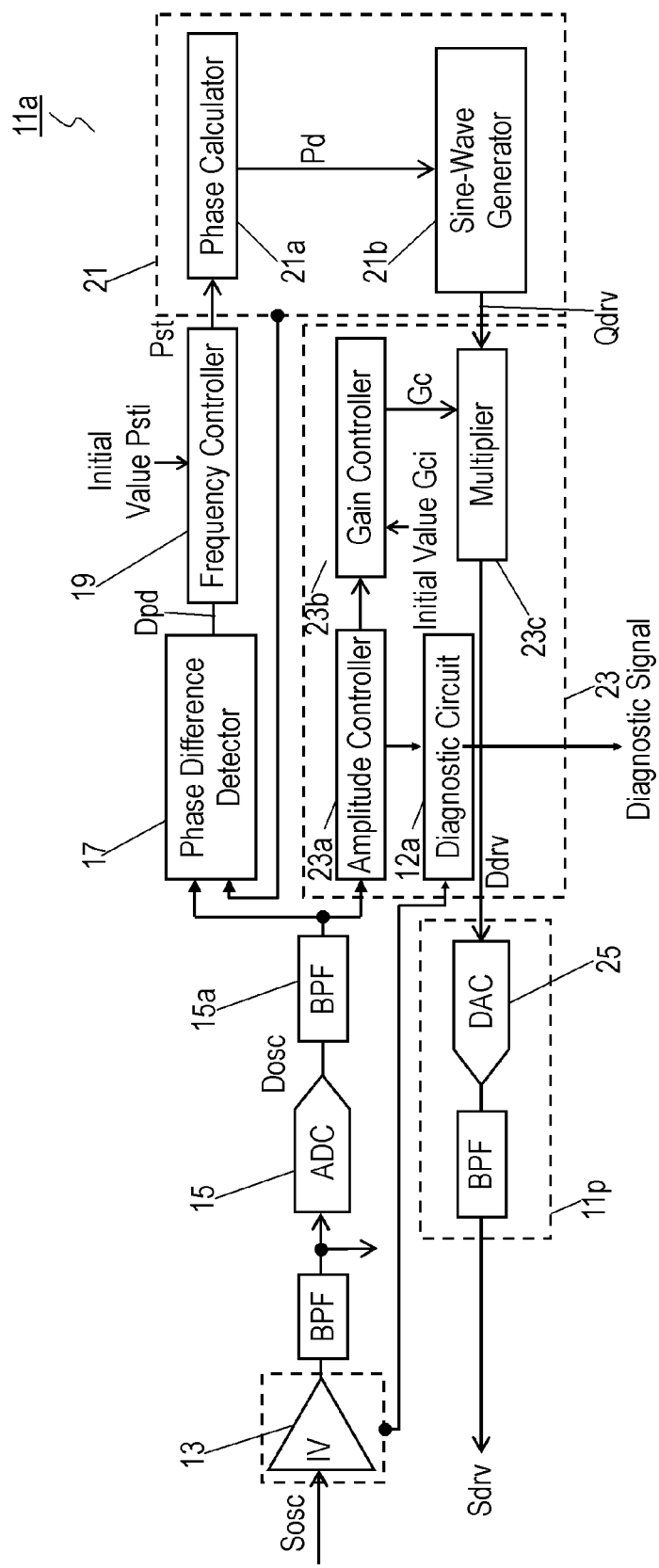
FIG. 17 is a block diagram of a drive circuit according to Exemplary Embodiment 4.

FIG. 17 is a block diagram of drive circuit 11a according to Exemplary Embodiment 4. In FIG. 17, components identical to those of drive circuit 11 according to Embodiment 1 shown in FIG. 3 are denoted by the same reference numerals. Drive circuit 11a further includes diagnostic circuit 12a connected to IV converter 13 and amplitude detector 23a of drive circuit 11 according to Embodiment 1 shown in FIG. 3.

In drive circuit 11a, IV converter 13 is implemented by amplifier circuit 200 shown in FIG. 13 or amplifier circuit 201 shown in FIG. 14 according to Embodiment 2.

Diagnostic circuit 12a determines whether or not the output of IV converter 13 is within a limited range, and determines whether or not the digital values downstream of ADC unit 15 are within a limited range that is a normal range.

In a similar operation to that of diagnostic circuit 12 according to Embodiment 3, when drive circuit 11a does not operate properly, diagnostic circuit 12a outputs a diagnostic result signal indicating that drive circuit 11a does not operate properly. When drive circuit 11a operates properly, diagnostic circuit 12a does not output the diagnostic result signal.

Figure 18:
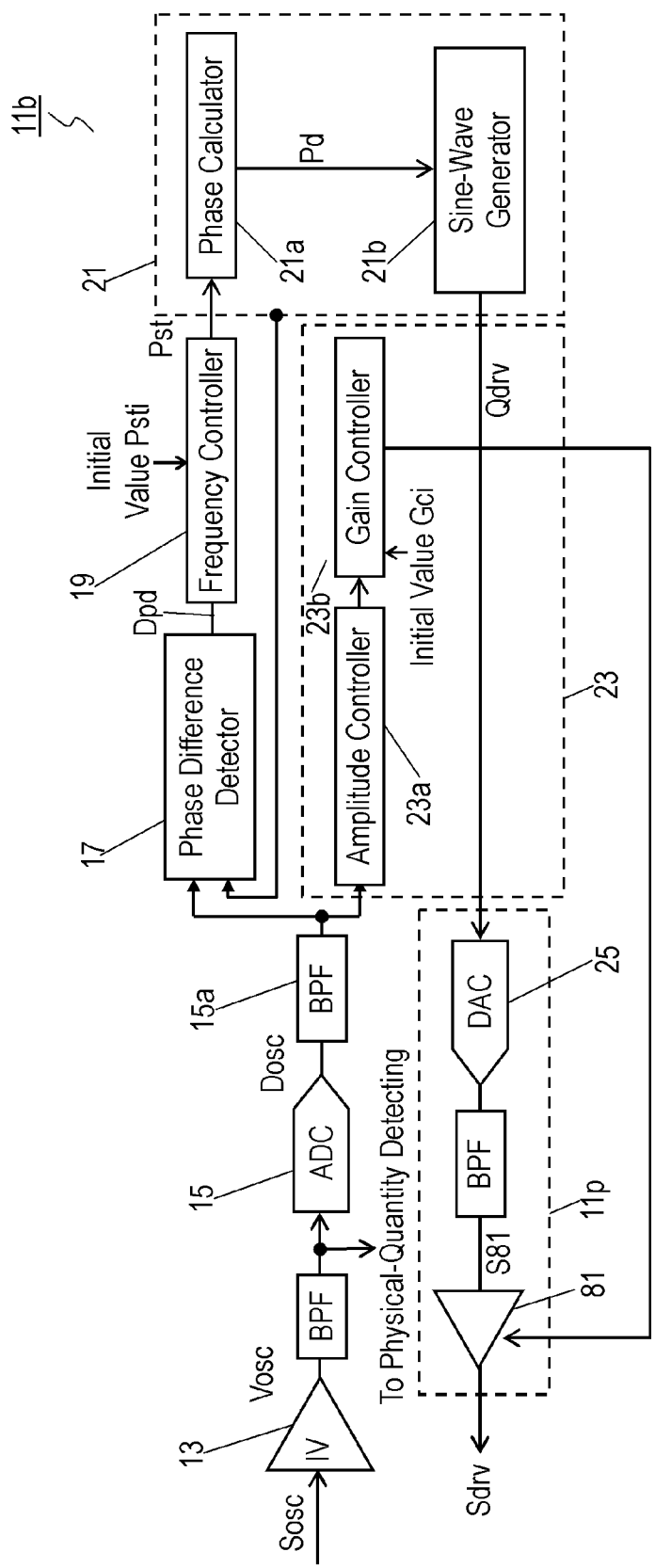
FIG. 18 is a block diagram of another drive circuit according to Embodiment 4.

FIG. 18 is a block diagram of another drive circuit 11b according to Embodiment 4. In FIG. 18, components identical to those of drive circuit 11 according to Embodiment 1 shown in FIG. 3 are denoted by the same reference numerals. Drive circuit 11b further includes amplifier circuit 81 connected to a BPF downstream of DAC 25 of an output unit 11p of drive circuit 11 according to Embodiment 1 shown in FIG. 3. Amplifier circuit 81 receives signal S81 output from DAC 25 via BPF, and outputs drive signal Sdrv. Amplifier circuit 81 is implemented by amplifier circuit 200 shown in FIG. 13 or amplifier circuit 201 shown in FIG. 14 according to Embodiment 2.

Amplifier circuit 81 can control the amplitude of signal S81 output from DAC 25 with upper limit L201 and lower limit L202 of limited range R201 for amplifier circuit 81 (201).

Amplifier circuit 81 can generate drive signal Sdrv having a predetermined amplitude by dynamically changing upper limit L201 and lower limit L202.

INDUSTRIAL APPLICABILITY

A physical quantity sensor according to the present invention can improve accuracy in phase adjustment while inhibiting an increase in sampling frequency, and is therefore useful as a physical quantity sensor, such as a tuning fork-type angular velocity sensor or a capacitance-type acceleration sensor that is used in, for example, mobile objects, mobile telephones, digital cameras, and gaming devices.

REFERENCE MARKS IN THE DRAWINGS 10 oscillator
10a oscillator body
11 drive circuit
13 IV converter 15 ADC unit
17 phase difference detector
19 frequency controller
21 drive signal generating unit
21a phase calculator
21b sine-wave generator
23 AGC unit
25 DAC
51 physical-quantity detecting circuit
70 electronic device
71 display unit
72 processor
73 memory
74 operating unit
100 detection-signal generating unit
101 waveform shaping unit
102 frequency multiplier
103 input amplifier
105 analog-digital converter
106, 606 sine-wave generating unit
106a phase calculator
106b address calculator
106c memory
106d sine-wave generator
107 temperature detector
108 low-pass filter
109 analog-digital converter
110 memory
115 multiplier
120 digital filter
t1 sampling point (first sampling point)
t11 sampling point (third sampling point)
t16 sampling point (second sampling point)
tzd1 zero-crossing point (first zero-crossing point)
tzd2 zero-crossing point (second zero-crossing point)
tzm1 zero-crossing point (third zero-crossing point)
200, 201 amplifier circuit
212 input (first input)
214 input (second input)
216 transistor (first transistor)
218 transistor (second transistor)
220 current amplifier (first current amplifier)
222 current source (first current source)
224 output port
226 feedback unit
242 amplifier (first amplifier)
244 amplifier (second amplifier)
246 amplifier (third amplifier)
266 transistor (third transistor)
268 transistor (fourth transistor)
270 current amplifier (second current amplifier)
272 current source (second current source)
280 output circuit

The invention claimed is:

1. A drive circuit configured to drive an oscillator to vibrate the oscillator, the oscillator outputting a monitor signal according to a physical quantity, the drive circuit comprising:
a drive signal generating unit that generates a drive signal having a drive frequency;
a phase difference detector that detects a phase difference between the monitor signal and the drive signal;
a frequency controller that controls the drive frequency based on the phase difference;
an automatic gain control (AGC) unit that controls an amplitude of the drive signal according to an amplitude of the monitor signal; and
an output unit that outputs the drive signal having the controlled amplitude to the oscillator,
wherein the phase difference detector obtains the phase difference Pd based on a time difference Tdm between the drive signal and the monitor signal and a period Tdrv of the drive signal according to a following formula:

$$Pd = \frac{Tdm}{Tdrv}.$$

2. The drive circuit according to claim 1, wherein
the oscillator has a resonance frequency; and
the frequency controller detects a difference between the drive frequency and the resonance frequency based on the phase difference so as to control the drive frequency.

3. The drive circuit according to claim 1, wherein the output unit outputs a sine wave signal having a predetermined frequency and a predetermined amplitude to the oscillator when starting the oscillator.

4. The drive circuit according to claim 1, wherein, when the oscillator outputs a current of the monitor signal, the drive circuit detects an amplitude of the monitor signal and is switched to control the drive signal by the AGC unit.

5. The drive circuit according to claim 1, wherein
the drive signal crosses a center value of the drive signal at a first zero-crossing point in a predetermined direction out of a rising direction and a falling direction, and crosses the center value of the drive signal at a second zero-crossing point subsequent to the first zero-crossing point in the predetermined direction, and
the phase difference detector is configured to:
sample the drive signal at a first sampling point immediately subsequent to the first zero-crossing point with a sampling clock;
sample the drive signal at a second sampling point immediately before the second zero-crossing point with the sampling clock; and
calculate the period Tdrv of the drive signal with a first fractional part Fr1 which is a duration from the first zero-crossing point to the first sampling point, a first integer part In1 which is a duration from the first sampling point to the second sampling point, and a second fractional part Fr2 which is a duration from the second sampling point to the second zero-crossing point according to a following formula:

$Tdrv=Fr1+In1+Fr2$.

6. The drive circuit according to claim 5, wherein
the monitor signal crosses a center value of the monitor signal at a third zero-crossing point subsequent to the first sampling point in the predetermined direction; and
the phase difference detector is configured to:
sample the monitor signal from the first sampling point to a third sampling point immediately before the third zero-crossing point with the sampling clock; and
calculate a time difference Tdm between the drive signal and the monitor signal with a second integer part In2 corresponding to a duration from the first sampling point to the third sampling point and a third fractional part Fr3 corresponding to a duration from the third sampling point to the third zero-crossing point according to a following formula:

$Tdm=Fr1+In2+Fr3$.

7. The drive circuit according to claim 1, wherein the phase difference detector starts detecting the phase difference after a predetermined duration elapses after starting of the oscillator.

8. The drive circuit according to claim 1, wherein the frequency controller controls the drive frequency by a proportional-derivative (PD) control at a steady state of the oscillator.

9. The drive circuit according to claim 1, wherein the drive circuit includes:
a first amplifier;
a second amplifier;
a first transistor connected to an output port of the first amplifier;
a second transistor connected to an output port of the second amplifier;
a first current amplifier connected to an output port of the first transistor and an output port of the second transistor; and
a first current source connected between the first transistor and the first current amplifier.

10. The drive circuit according to claim 9, wherein the drive circuit further includes:
a third transistor connected to an output port of the first amplifier;
a third amplifier;
a fourth transistor connected to an output port of the third amplifier;
a second current amplifier connected to an output port of the third transistor and an output port of the fourth transistor; and
a second current source connected between the third transistor and the second current amplifier.

11. The drive circuit according to claim 10, wherein
the drive circuit further includes a push-pull controlled output circuit connected to the second current amplifier, and
the third amplifier includes a first input port and a second input port, the first input port being connected to a limited range of set values, the second input port having the output circuit input thereto.

12. The drive circuit according to claim 9, wherein
the drive circuit further includes a push-pull controlled output circuit connected to the first current amplifier, and
the second amplifier includes a first input port and a second input port, the first input port being connected to a limited range of set values, the second input port having the output circuit input thereto.

13. A drive circuit configured to drive an oscillator to vibrate the oscillator, the oscillator outputting a monitor signal according to a physical quantity, the drive circuit comprising:
a drive signal generating unit that generates a drive signal having a drive frequency;
a phase difference detector that detects a phase difference between the monitor signal and the drive signal;
a frequency controller that controls the drive frequency based on the phase difference;
an automatic gain control (AGC) unit that controls an amplitude of the drive signal according to an amplitude of the monitor signal; and
an output unit that outputs the drive signal having the controlled amplitude to the oscillator,
wherein the drive circuit includes:
a first input port;
a second input port;
a first transistor connected to an output port of the first input port;
a second transistor connected to an output port of the second input port;
a first current amplifier connected to an output port of the first transistor and an output port of the second transistor; and
a first current source connected between the first transistor and the first current amplifier.

14. The drive circuit according to claim 13, wherein the output port of the first transistor is connected to a primary side of the first current amplifier.

15. The drive circuit according to claim 13, wherein
the first current source is connected to a first potential, and
the first transistor, the second transistor, and the first current amplifier are connected to a second potential higher than the first potential.

* * * * *